(12) United States Patent
Shoji

(10) Patent No.: US 7,868,613 B2
(45) Date of Patent: Jan. 11, 2011

(54) MAGNETIC SENSOR AND MANUFACTURING METHOD THEREOF

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 374 days.

(21) Appl. No.: 11/976,178

(22) Filed: Oct. 22, 2007

(65) Prior Publication Data

US 2008/0100290 A1    May 1, 2008

(30) Foreign Application Priority Data

Oct. 31, 2006  (JP) .............................. 2006-296407

(51) Int. Cl.
  *G01R 33/09* (2006.01)
  *H01L 43/08* (2006.01)
  *G01B 7/14* (2006.01)

(52) U.S. Cl. .................................. 324/252; 324/207.21

(58) Field of Classification Search ............ 324/207.21, 324/252; 338/32 R; 360/324, 324.1, 324.11, 360/324.12
See application file for complete search history.

(56) References Cited

U.S. PATENT DOCUMENTS

| | | | | |
|---|---|---|---|---|
| 5,561,368 | A * | 10/1996 | Dovek et al. ................. | 324/252 |
| 6,452,382 | B1 * | 9/2002 | Tokunaga et al. ......... | 324/207.21 |
| 6,920,684 | B2 | 7/2005 | Shonai et al. | |
| 7,427,859 | B2 * | 9/2008 | Fukuoka et al. ......... | 324/207.21 |
| 7,646,196 | B2 * | 1/2010 | Shoji .......................... | 324/252 |
| 2008/0012558 | A1 * | 1/2008 | Rossler et al. ............. | 324/252 |

FOREIGN PATENT DOCUMENTS

| | | |
|---|---|---|
| JP | A-06-174471 | 6/1994 |
| JP | A 08-226960 | 9/1996 |
| JP | B2-3318762 | 6/2002 |
| JP | A 2003-008101 | 1/2003 |
| JP | A 2003-066127 | 3/2003 |
| JP | A-2003-066127 | 3/2003 |
| JP | A-2003-088127 | 3/2003 |
| JP | A 2004-029007 | 1/2004 |
| JP | A 2005-069744 | 3/2005 |
| JP | A 2006-019383 | 1/2006 |

* cited by examiner

*Primary Examiner*—Kenneth J Whittington
(74) *Attorney, Agent, or Firm*—Oliff & Berridge, PLC

(57) ABSTRACT

First and second MR elements are provided with a plurality of element patterns each having a stacked structure. The stacked structure includes a free layer changing its magnetization direction depending on an external magnetic field, an intermediate layer generating no specific magnetization direction, and a pinned layer having magnetization pinned in a certain direction. The first and the second MR elements have a rotationally symmetrical relationship with each other around a central axis parallel to the directions of anisotropic magnetic fields of the free layer. In the initial condition, the resistance of the first MR element and the resistance of the second MR element are equal to each other. The resistances of the first and the second MR elements exhibit changes in opposite directions in accordance with a magnetic field to be detected. This provides a magnetic sensor permitting higher-precision detection of the magnetic field to be detected.

18 Claims, 23 Drawing Sheets

MAGNETIC SENSOR AND MANUFACTURING METHOD THEREOF

BACKGROUND OF THE INVENTION

1. Field of the Invention

The present invention relates to a magnetic sensor capable of detecting a change in a magnetic field with high sensitivity, and a method of manufacturing the magnetic sensor.

2. Description of the Related Art

As a magnetic sensor for detecting the direction of a micro magnetic field such as geomagnetism, there has been known one using an anisotropic magneto-resistive element formed of a ferromagnetic material such as permalloy (for example, refer to Japanese Patent No. 3318762 and Japanese Unexamined Patent Application Publication No. Hei 6-174471).

Recently, there has been developed a magnetic sensor provided with a plurality of giant magneto-resistive elements exhibiting higher detective sensitivity to a change in a magnetic field than the anisotropic magneto-resistive element (for example, refer to Japanese Unexamined Patent Application Publication No. 2003-66127). In this type of the magnetic sensor, a bridge circuit is configured by, for example, four GMR elements, and when a micro magnetic field to be detected (hereinafter referred to as a "magnetic field to be detected"), the resistances of certain two GMR elements are changed in the positive direction and the resistances of the remaining two GMR elements are changed in the negative direction. The magnitude of the magnetic field to be detected can be measured by detecting a difference in the resistance change of each GMR element (a differential output).

SUMMARY OF THE INVENTION

All of the four GMR elements configuring the bridge circuit as described in Japanese Unexamined Patent Application Publication No. 2003-66127 are required to exhibit the same resistance in the condition where no magnetic field to be detected is applied (i.e. the measurement wait condition). Even if one of the four GMR elements exhibits a different resistance, a differential output (an offset voltage) of the bridge circuit may be generated even in the measurement wait condition. The resistance in each GMR element can be determined mainly by the angle formed between the magnetization direction of a free layer and the magnetization direction of a pinned layer. The magnetization direction of the free layer can also be influenced by the direction and magnitude of the anisotropic magnetic field, and the magnitude and direction of an exchange bias field to be generated between the pinned layer and the free layer. Therefore, in order to equalize the resistances in all of the magneto-resistive elements, it is necessary to bring the anisotropic magnetic field direction and the magnetization direction of the pinned layer into coincidence with each other.

In fact, there are relatively large variations (manufacturing errors) in the angle formed between the anisotropic magnetic field direction and the magnetization direction of the pinned layer. Therefore, it is extremely difficult to completely eliminate the generation of the abovementioned offset voltage. However, the offset voltage becomes a large error factor when measuring, for example, a magnetic field of an extremely micro magnetic field such as geomagnetism (for example, 1 Oe ($=(2500/\pi)$ A/m) or below). Hence, there is a need for a magnetic sensor which can reduce the offset voltage due to manufacturing errors, and measure a magnetic field to be detected with higher precision.

It is desirable to provide a magnetic sensor capable of detecting the magnitude of a magnetic field to be detected with higher precision, and a method of manufacturing the magnetic sensor.

A first magnetic sensor of an embodiment of the invention includes first and second magneto-resistive elements each having a stacked structure. The stacked structure includes a pinned layer having a magnetization direction pinned in a certain direction, a non-magnetic intermediate layer, and a free layer changing its magnetization direction depending on an external magnetic field, and generating an anisotropic magnetic field in a different direction from the magnetization direction of the pinned layer. The first and the second magneto-resistive elements are in such a relationship that the first and the second magneto-resistive elements come coincident with each other when performing a rotational operation around a central axis of rotation parallel to the stacked surfaces of the stacked structure or performing both of the rotational operation and a parallel shift operation. The term "rotational operation" means the operation of 180° rotational transfer, while maintaining the configurational symmetry including the magnitude and direction of magnetization. That is, when one of the magneto-resistive elements is rotated 180° (including a drift of the order of a manufacturing error) around the central axis of rotation, the magneto-resistive element comes coincident with (overlaps) the other of magneto-resistive elements. The term "anisotropic magnetic field" means all of anisotropic magnetic fields caused by the crystalline structure and shape.

In the first magnetic sensor of the invention, the first and the second magneto-resistive elements are in such a relationship that the first and the second magneto-resistive elements come coincident with each other when performing the rotational operation around the central axis of rotation or performing both of the rotational operation and the parallel shift operation. Therefore, in the first and the second magneto-resistive elements, the relative angles in the initial condition between the magnetization direction of the free layer and the magnetization direction of the pinned layer are equal to each other. Further, in the first and the second magneto-resistive elements, the resistance values will exhibit changes in opposite directions, depending on a magnetic field to be detected. The term "initial condition" means the condition where no external magnetic field including a magnetic field to be detected is applied to the first and the second magneto-resistive elements. The initial condition can be attained by, for example, applying a refresh magnetic field having at least the magnitude of a magnetization saturation magnetic field of the free layer, to both of the first and the second magneto-resistive elements, along the central axis of rotation.

A second magnetic sensor of another embodiment of the invention includes first to fourth magneto-resistive elements each having a stacked structure. The stacked structure includes a pinned layer having a magnetization direction pinned in a certain direction, a non-magnetic intermediate layer, and a free layer. The free layer changes its magnetization direction depending on an external magnetic field, and generates an anisotropic magnetic field in a different direction from the magnetization direction of the pinned layer. The first and the third magneto-resistive elements are in such a relationship that the first and the third magneto-resistive elements come coincident with each other when performing the parallel shift operation, and the second and the fourth magneto-resistive elements are in such a relationship that the second and the fourth magneto-resistive elements come coincident with each other when performing the parallel shift operation. The first and the third magneto-resistive elements and the second and the fourth magneto-resistive elements are in such a relationship that the first and the third magneto-resistive elements and the second and the fourth magneto-resistive elements come coincident (overlap) with each other when performing the rotational operation around the central axis of rotation or performing both of the rotational operation and the parallel shift operation. The term "coming coincident with each other" means the relationship in which all the configurations, including the magnitude and direction of magnetization are coincident with each other.

In the second magnetic sensor of the invention, the first and the third magneto-resistive element come coincident with each other when performing the parallel shift operation, and the second and the fourth magneto-resistive elements come coincident with each other when performing the parallel shift operation. Further, the first and the second magneto-resistive elements come coincident with each other when performing the rotational operation around the central axis of rotation or performing both of the rotational operation and the parallel shift operation, and the third and the fourth magneto-resistive elements come coincident with each other when performing the rotational operation around the central axis of rotation or performing both of the rotational operation and the parallel shift operation. Therefore, in all of the first to the fourth magneto-resistive elements, the relative angles in the initial condition between the magnetization direction of the free layer and the magnetization direction of the pinned layer are equal to each other. Further, the resistances of the first and the third magneto-resistive elements and the resistances of the second and the fourth magneto-resistive elements will exhibit changes in opposite directions, depending on a magnetic field to be detected. The initial condition can be attained by, for example, applying a refresh magnetic field having at least the magnitude of a magnetization saturation magnetic field of the free layer is saturated, to all of the first to the fourth magneto-resistive elements, along the central axis of rotation.

Thus, in the first and the second magnetic sensors of the invention, by providing a refresh magnetic field applying means, the refresh magnetic field generated by the means can be temporarily applied to saturate the free layers of the magneto-resistive elements. In this case, the magnetization directions of the free layer can be lined up in a certain direction even if the magnetization directions of the free layer is disturbed by any unnecessary magnetic field from the exterior (a disturbance magnetic field), In particular, by bringing the anisotropic magnetic fields of the free layers in the magneto-resistive elements into coincidence with each other, and the refresh magnetic field applying means are preferably arranged so as to generate the refresh magnetic field along the coincidental direction of the anisotropic magnetic fields of the free layer. In this case, the directions of the anisotropic magnetic fields of the free layers can be stabilized, and the output of the magneto-resistive elements can be stabilized at a high level. In cases where there is little or no influence of the disturbance magnetic field, and the directions of the anisotropic magnetic fields of the free layers are sufficiently stable, it is unnecessary to apply the refresh magnetic field.

A method of manufacturing a first magnetic sensor in an embodiment of the invention includes steps of: (i) forming, in a batch, a plurality of magneto-resistive elements, each magneto-resistive element including, in order on a substrate, a first ferromagnetic layer, a non-magnetic intermediate layer, and a second ferromagnetic layer, the first ferromagnetic layer generating an anisotropic magnetic field in a certain direction and changing its magnetization direction depending on a magnetic field to be detected, and the second ferromagnetic layer having coercive force larger than that of the first ferromagnetic layer; (ii) setting, in a batch, magnetization directions of the second ferromagnetic layers in all of the plurality of magneto-resistive elements so as to be different from the anisotropic magnetic field direction; (iii) cutting a pair of magneto-resistive elements out of the plurality of magneto-resistive elements formed on the substrate; and (iv) arranging the cut pair of magneto-resistive elements so as to come coincident with each other when performing the rotational operation around a central axis of rotation parallel to the stacked surfaces of the stacked structure or performing both of the rotational operation and a parallel shift operation.

With the method of manufacturing the first magnetic sensor in the invention, from the plurality of magneto-resistive elements which are stacked, in a batch, on a substrate and regularized, a pair of magneto-resistive elements are cut and arranged so as to come coincident with each other when performing the rotational operation or performing both of the rotational operation and the parallel shift operation. This leads to a relatively small error of the relative angle between the magnetization direction of the pinned layer and the anisotropic magnetic field direction of the free layer in the mutual relationship between the pair of magneto-resistive elements.

A method of manufacturing a second magnetic sensor in another embodiment of the invention includes steps of: (i) forming, in a batch, a plurality of magneto-resistive elements, each magneto-resistive element including, in order on a substrate, a first ferromagnetic layer, a non-magnetic intermediate layer, and a second ferromagnetic layer, the first ferromagnetic layer generating an anisotropic magnetic field in a certain direction and changing its magnetization direction depending on a magnetic field to be detected, and the second ferromagnetic layer having coercive force larger than that of the first ferromagnetic layer; (ii) setting, in a batch, magnetization directions of the second ferromagnetic layers in all of the plurality of magneto-resistive elements so as to be different from the anisotropic magnetic field direction; (iii) forming a pair of element modules each including two pieces of the magneto-resistive elements by cutting the substrate with the plurality of magneto-resistive elements formed; (iv) cutting a pair of element modules each including two magneto-resistive elements from the plurality of magneto-resistive elements formed on the substrate; and (v) arranging the cut pair of magneto-resistive elements so as to come coincident with each other when performing a rotational operation or performing both of the rotational operation and the parallel shift operation.

With the method of manufacturing the second magnetic sensor in the invention, a pair of element modules each containing two magneto-resistive elements selected from the plurality of magneto-resistive elements, which are stacked, in a batch, on a substrate and regularized, are cut and arranged so as to come coincident with each other when performing a rotational operation or performing both of the rotational operation and the parallel shift operation, to one of the cut pair of magneto-resistive elements.

This leads to a relatively small error of the relative angle between the magnetization direction of the pinned layer and the anisotropic magnetic field direction of the free layer in the mutual relationships of the four magneto-resistive elements.

According to the first magnetic sensor of the invention, the first and the second magneto-resistive elements are arranged so as to come coincident with each other when performing the rotational operation around the central axis of rotation or performing both of the rotational operation and the parallel shift operation. It is therefore possible to reduce the offset output due to a difference of resistance between the two in the initial condition. This permits higher-precision detection of the output based on a magnetic field to be detected.

According to the second magnetic sensor of the invention, the first and the third magneto-resistive elements come coincident with each other when performing the parallel shift operation, and the second and the fourth magneto-resistive elements come coincident with each other when performing the parallel shift operation. Further, the first and the second magneto-resistive elements come coincident with each other when performing the rotational operation around the central axis of rotation or performing both of the rotational operation and the parallel shift operation, and the third and the fourth magneto-resistive elements come coincident with each other when performing the rotational operation around the central axis of rotation or performing both of the rotational operation and the parallel shift operation. It is therefore possible to reduce the offset output due to a difference of resistance between the two in the initial condition. This permits higher-precision detection of the output based on a magnetic field to be detected.

According to the first or the second magnetic sensor of the invention, the free layers can be saturated and the magnetization directions thereof can be temporarily lined up (the initial condition can be attained) by providing the refresh magnetic field applying means so as to temporarily apply a refresh magnetic field to all of the magneto-resistive elements. Consequently, even micro magnetic fields of the order to geomagnetism can be detected stably with higher precision by detecting a magnetic field to be detected after the refresh magnetic field is applied to all of the magneto-resistive elements. In particular, the initial condition can be obtained easily by applying the abovementioned refresh magnetic field in the anisotropic magnetic field direction in cases where the directions of the anisotropic magnetic fields in both of the first and the second magneto-resistive elements, or all of the directions of the anisotropic magnetic fields in all of the first to the fourth magneto-resistive elements are brought into coincidence with the central axis of rotation.

According to the method of manufacturing the first magnetic sensor in the invention, after all of the formed, in a batch, plurality of magneto-resistive elements on a substrate are subject to regularization in a batch so that the anisotropic magnetic field direction of the first ferromagnetic layer and the magnetization direction of the second ferromagnetic layer are different to each other, the pair of magneto-resistive elements cut from the substrate are arranged so as to come coincident with each other when performing the rotational operation around the central axis of rotation or performing both of the rotational operation and the parallel shift operation. This enables a reduction in the error of the relative angle between the magnetization direction of the pinned layer and the anisotropic magnetic field direction of the free layer in the mutual relationship between the pair of magneto-resistive elements. Hence, the offset output due to the error of the relative angle can be reduced to realize a magnetic sensor capable of measuring a magnetic field to be detected with higher precision.

According to the method of manufacturing the second magnetic sensor in the invention, after all of the formed, in a batch, plurality of magneto-resistive elements on a substrate are subject to regularization in a batch so that the anisotropic magnetic field direction of the first ferromagnetic layer and the magnetization direction of the second ferromagnetic layer are different to each other, a pair of element modules each including the two magneto-resistive elements cut from the substrate are arranged so as to come coincident with each other when performing the rotational operation around the central axis of rotation or performing both of the rotational operation and the parallel shift operation. This enables a reduction in the error of the relative angle between the magnetization direction of the pinned layer and the anisotropic magnetic field direction of the free layer in the mutual relationship among the four magneto-resistive elements. Hence, the offset output due to the error of the relative angle can be reduced to realize a magnetic sensor permitting higher-precision measurement of a magnetic field to be detected.

Other and further objects, features and advantages of the invention will appear more fully from the following description.

DESCRIPTION OF THE PREFERRED EMBODIMENTS

Preferred embodiments of the present invention will now be described in detail with reference to the accompanying drawings.

First Preferred Embodiment

Figure 1:
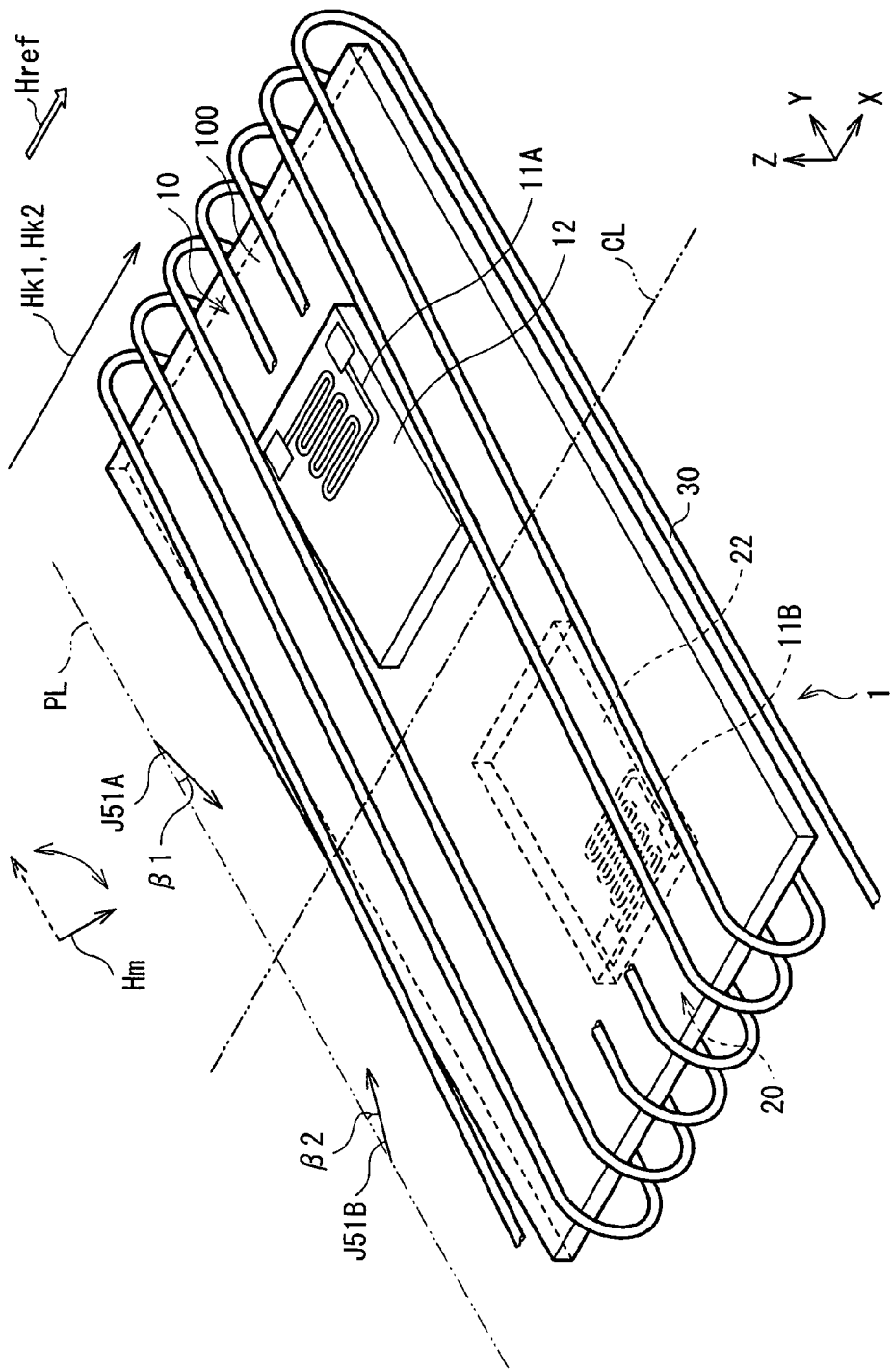
FIG. 1 is a perspective view showing the configuration of a magnetic sensor as a first preferred embodiment in the present invention.

The configuration of a magnetic sensor as a first preferred embodiment in the present invention will be firstly described with reference to FIG. 1 and the like. FIG. 1 is a schematic diagram showing the perspective configuration of a magnetic sensor 1 of the present embodiment.

The magnetic sensor 1 has on an integrated substrate 100 a first module 10 with a first magneto-resistive (MR) element 11A overlying an element substrate 12, and a second module 20 with a second magneto-resistive (MR) element 11B overlying an element substrate 22. The element substrates 12 and 22 are, for example, AlTiC ($Al_2O_3$.TiC) substrates or silicon (Si) substrates, a surface of which is insulated, specifically on a surface of which an aluminum oxide layer is provided. The first module 10 is provided on the upper surface of the integrated substrate 100, and the second module 20 is provided on the lower surface of the integrated substrate 100. That is, the first and the second modules 10 and 20 have a rotationally symmetrical relationship with each other around a central axis CL passing through the integrated substrate 100. In other words, when one of the MR elements (for example, the first MR element 11A) is rotated 180° around the central axis CL, it is brought into a relationship of being configurationally coincident with the other (the second MR element 11B). The central axis CL is parallel to axes of easy magnetization Hk1 and Hk2 to be described later. In the present embodiment, the direction along the central axis CL is X direction, the direction orthogonal to the X direction in the plane of the integrated substrate 100 is Y direction, and the direction orthogonal to the plane of the integrated substrate 100 is Z direction. The magnetic sensor 1 is for detecting the magnitude of a magnetic field Hm to be detected, which is changed in a certain rotational plane (i.e. the XY plane).

The magnetic sensor 1 is provided with a coil 30 for generating a refresh magnetic field Href. The coil 30 is a conductor wound around the central axis CL in the periphery of the integrated substrate 100. When current flows, the coil 30 generates the refresh magnetic field Href in the directions of anisotropic magnetic fields Hk1 and Hk2 (i.e. +X direction), and applies this to the first and the second MR elements 11A and 11B. The refresh magnetic field Href has at least the magnitude of a magnetic field at which the magnifications of free layers 53A and 53B to be described later are saturated.

Figure 2A:
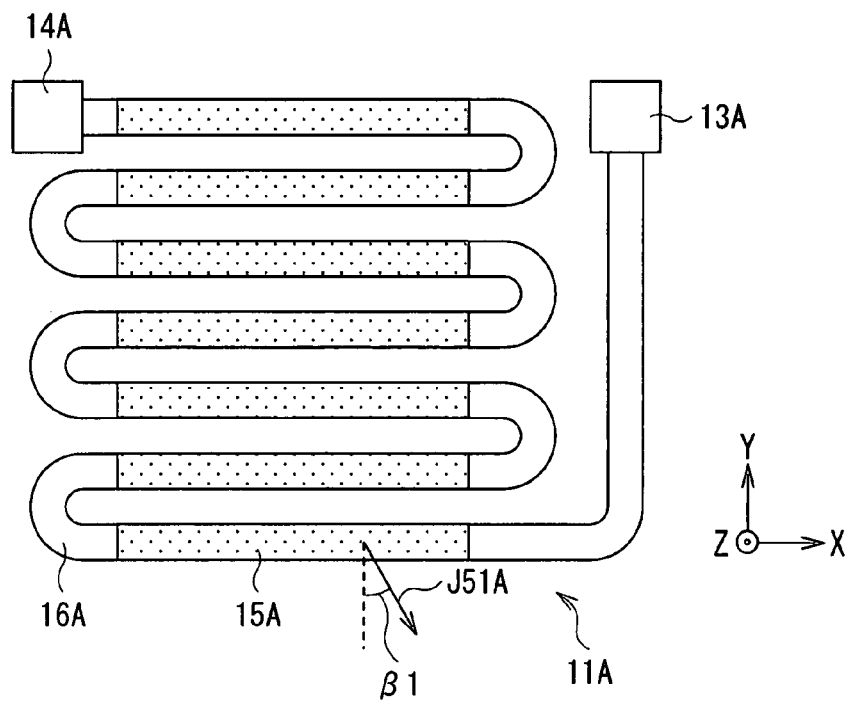
FIGS. 2A and 2B are plan views showing in enlarged dimension first and second MR elements shown in FIG. 1, respectively.
Figure 2B:
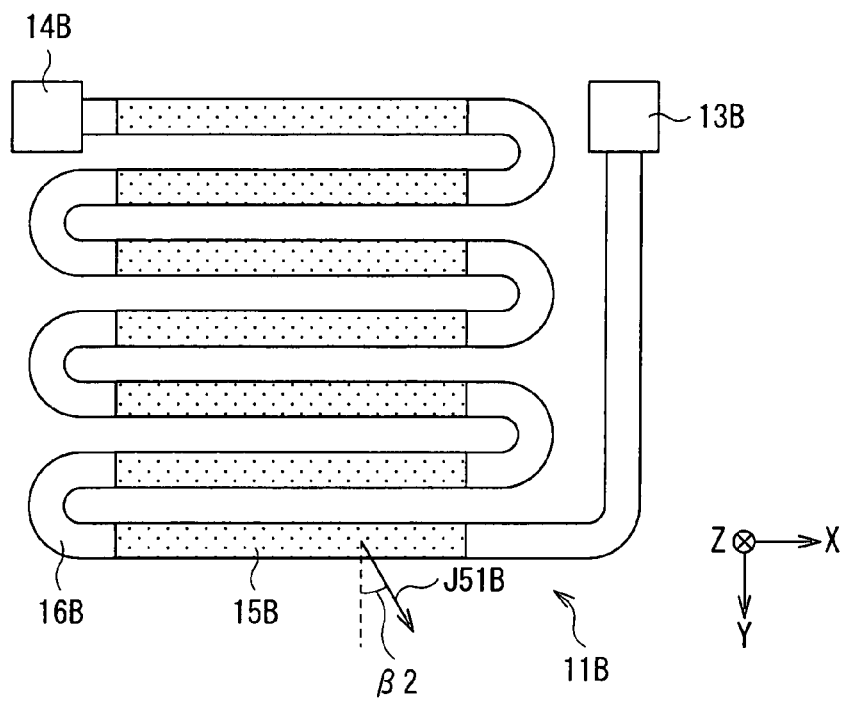

FIGS. 2A and 2B are plan views showing in enlarged dimension the first and the second MR elements 11A and 11B shown in FIG. 1. The first MR element 11A has a plurality of element patterns 15A, as shown in FIG. 2A where seven element patterns 15A are shown, between a pair of electrodes 13A and 14A formed of copper or the like. The plurality of element patterns 15A can be formed by using sputtering method and photolithography method, and they are in the shape of a strip extending in the X direction, and are arranged so as to be adjacent to each other in the Y direction orthogonal to the X direction. Both ends in a longitudinal direction (the X direction) of each of the plurality of element patterns 15A thus arranged are connected to each other by a connecting portion 16A formed of a non-magnetic conductive layer of copper or the like, so that the element patterns 15A have the shape of a zigzag between electrodes 13A and 14A.

The second MR element 11B has approximately the same configuration as the first MR element 11A, and has a plurality of element patterns 15B, as shown in FIG. 2B where seven element patterns 15B are shown, between a pair of electrodes 13B and 14B formed of copper or the like. The plurality of element patterns 15B can be formed by using sputtering method or the like, and they are in the shape of a strip extending in the X direction, and are arranged so as to be adjacent to each other in the Y direction. Both ends in a longitudinal direction (the X direction) of each of the plurality of element patterns 15B thus arranged are connected to each other by a connecting portion 16B formed of a non-magnetic conductive layer of copper or the like, so that the element patterns 15B have the shape of a zigzag between electrodes 13B and 14B.

FIGS. 3 and 4 are exploded perspective views showing in enlarged dimension the element patterns 15A and 15B shown in FIGS. 2A and 2B, respectively. As shown in FIGS. 3 and 4, the element patterns 15A and 15B have a spin-valve structure where a plurality of functional films including a magnetic layer are stacked one upon another. Specifically, (i) free layers 53A and 53B having magnetizations J53A and J53B, respectively, the direction of which is changed depending on an external magnetic field, including the magnetic field Hm to be detected, (ii) non-magnetic intermediate layers 52A and 52B exhibiting no specific magnetization direction, and (iii) pinned layers 51A and 51B having magnetizations J51A and J51B pinned in a certain direction, respectively, are stacked in order on the element substrates 12 and 22, respectively. The free layers 53A and 53B produce anisotropic magnetic fields Hk1 and Hk2 in the X direction, respectively. Here, the anisotropic magnetic fields Hk1 and Hk2 mean all of anisotropic magnetic fields including anisotropic magnetic field components due to the crystalline structure of the free layers 53A and 53B, and anisotropic magnetic field components due to the shape of the free layers 53A and 53B. The directions of the magnetizations J51A and J51B of the pinned layers 51A and 51B are slightly inclined from an orthogonal axis PL orthogonal to the central axis CL, as shown in FIG. 1 and FIGS. 2A and 2B. More particularly, the direction of the magnetization J51A is inclined from −Y direction to +X direction at an angle β1, and the direction of the magnetization J51B is inclined from +Y direction to +X direction at an angle β2. Preferably, the angles β1 and β2 are equal to each other. The relative angles between the directions of the magnetizations J51A, 51B, and the directions of the anisotropic magnetic fields Hk1, Hk2 are respectively greater than 0° and less than 90°.

Figure 3A:
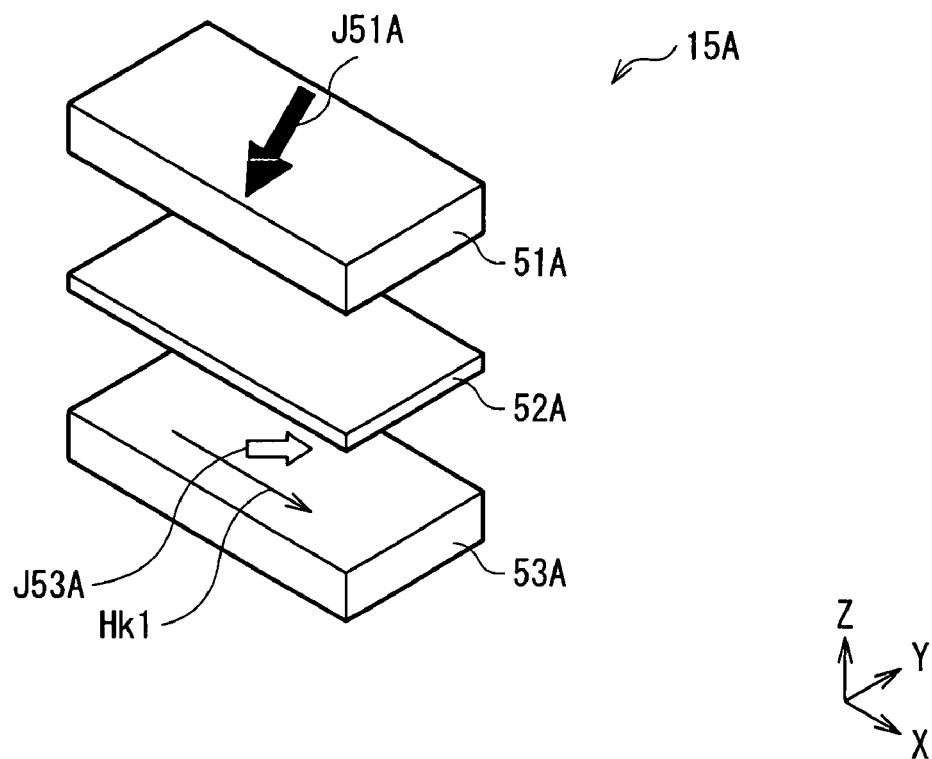
FIGS. 3A and 3B are exploded perspective views showing the configuration of an element pattern as a key part of the first MR element shown in FIG. 2A.
Figure 3B:
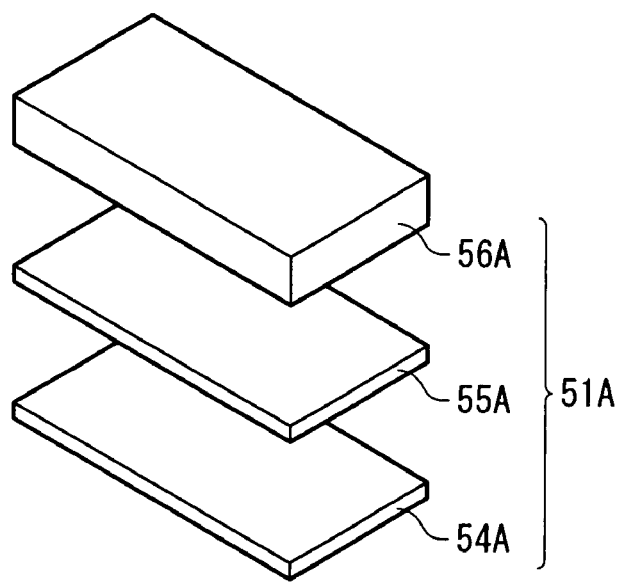
Figure 4A:
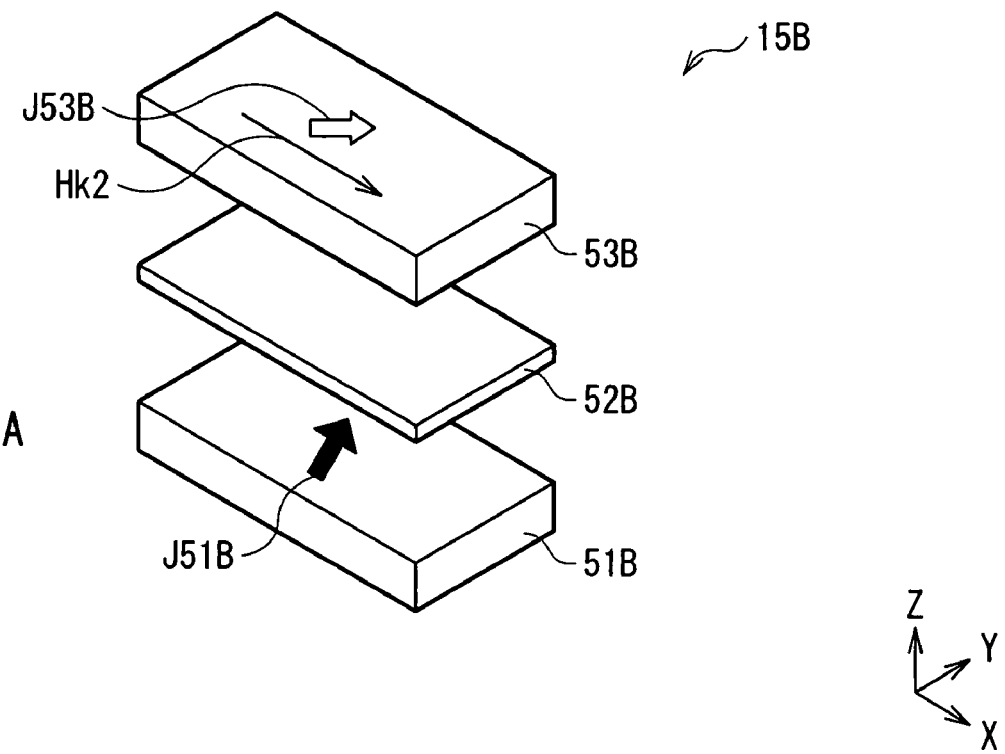
FIGS. 4A and 4B are exploded perspective views showing the configuration of an element pattern as a key part of the second MR element shown in FIG. 2B.
Figure 4B:
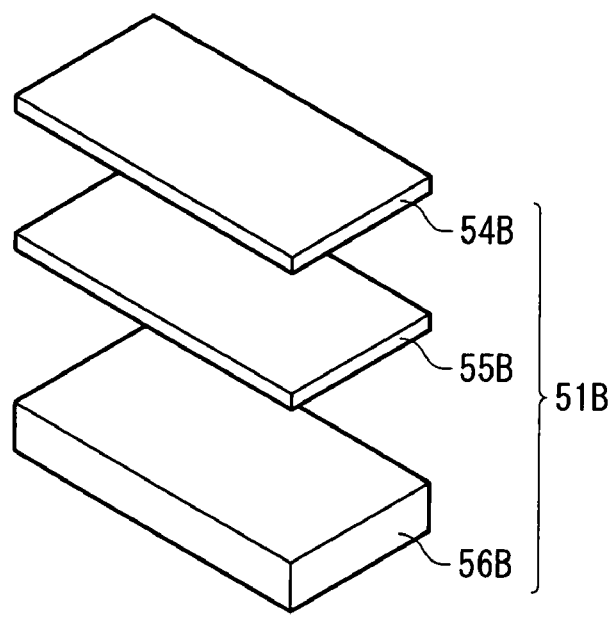

FIGS. 3B and 4B show the detailed configurations of the pinned layers 51A and 51B, respectively. The pinned layer 51A is made up of a magnetization fixing film 54A, an antiferromagnetic film 55A, and a protection film 56A, which are stacked in the order named from the side of the intermediate layer 52A. Similarly, the pinned layer 51B is made up of a magnetization fixing film 54B, an antiferromagnetic film 55B, and a protection film 56B, which are stacked in the order named from the side of the intermediate layer 52B. The magnetization fixing films 54A and 54B are formed of a ferromagnetic material such as cobalt (Co) or cobalt-iron alloy (CoFe). The magnetization directions exhibited by the magnetization fixing films 54A and 54B become the directions of the magnetizations J51A and J51B as a whole of the pinned layers 51A and 51B, respectively. On the other hand, the antiferromagnetic films 55A and 55B are formed of an antiferromagnetic material such as platinum-manganese alloy (PtMn) or iridium-manganese alloy (IrMn). The antiferromagnetic films 55A and 55B are in the condition where the spin magnetic moment in one direction and the spin magnetic moment in the reverse direction completely cancel with each other, and function to fix the magnetization directions of the magnetization fixing films 54A and 54B. The protection films 56A and 56B are formed of a chemically stable non-magnetic material such as tantalum (Ta) or hafnium (Hf), and protect the magnetization fixing films 54A and 54B and the antiferromagnetic films 55A and 55B, respectively. The free layers 53A and 53B are formed of a soft magnetic material such as nickel-iron alloy (NiFe). The intermediate layers 52A and 52B are formed of a high-conductive non-magnetic material such as copper (Cu) or gold (Au).

Figure 5A:
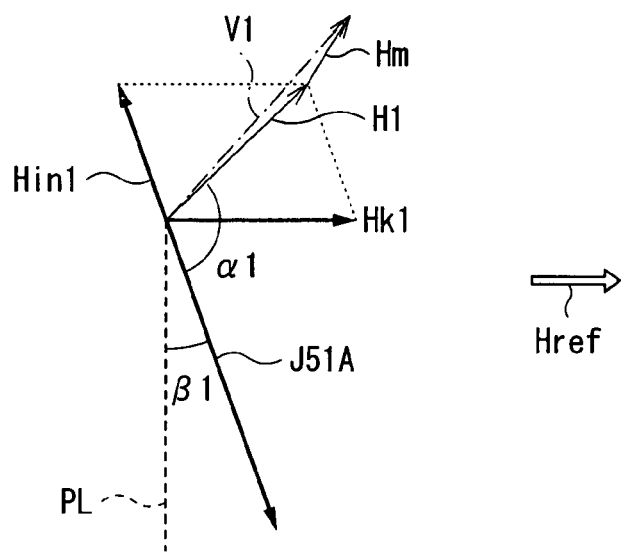
FIGS. 5A and 5B are explanatory drawings for explaining the relationship between the magnetization direction and the magnetic field direction in the key parts of the first and the second MR elements shown in FIG. 1, respectively.
Figure 5B:
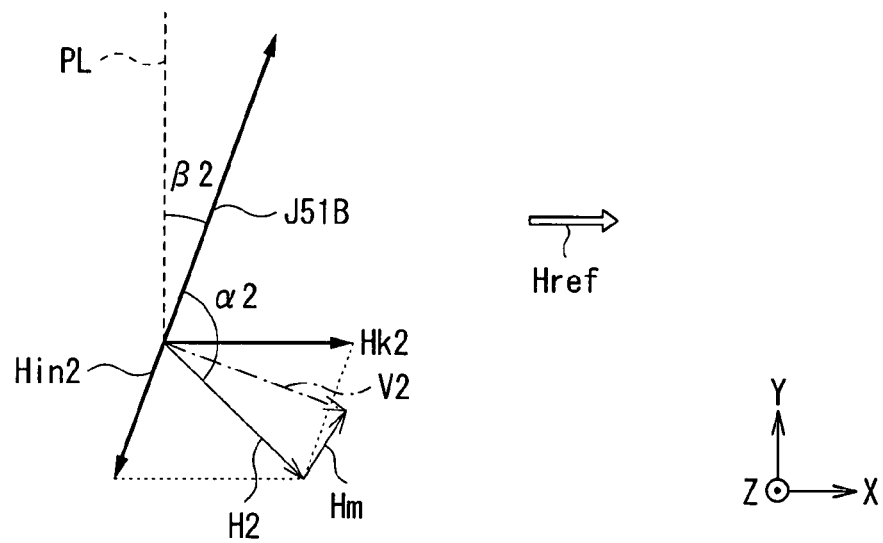

FIGS. 3A and 4A show the unloaded condition where there is no application of an external magnetic field H, including the magnetic field Hm to be detected. In this condition, the magnetization vectors and the magnetic field vectors in the first and the second MR elements 11A and 11B have a rotationally symmetrical relationship with each other around an axis parallel to the anisotropic magnetic fields Hk1 and Hk2 (i.e. the central axis CL). The magnetization J53A of the free layer 53A is directed to the direction of a composite magnetic field H1 resulting from an exchange-coupling magnetic field Hin1 generated between the pinned layer 51A and the free layer 53A, and the anisotropic magnetic field Hk1 of the free layer 53A (refer to FIG. 5A). Similarly, the magnetization J53B of the free layer 53B is directed to the direction of a composite magnetic field H2 resulting from an exchange-coupling magnetic field Hin2 generated between the pinned layer 51B and the free layer 53B, and the anisotropic magnetic field Hk2 of the free layer 53B (refer to FIG. 5B). On the other hand, the magnetizations J51A and J51B of the pinned layers 51A and 51B are directed in a direction that forms a relative angle of greater than 0° and less than 90°, with respect to the anisotropic magnetic fields Hk1 and Hk2, respectively. For example, there are formed angles α1 and α2 with respect to the composite magnetic fields Hk1 and Hk2, respectively. Preferably, each of the angles α1 and α2 is 90°, irrespective of the presence and absence of the magnetic field Hm to be detected. This is because the abovementioned configuration enables the element patterns 15A and 15B to produce the maximum output. The exchange-coupling magnetic fields Hin1 and Hin2 have opposite vectors to the magnetizations J51A and J51B, respectively. Preferably, the magnetization J51A, the anisotropic magnetic field Hk1 and the exchange-coupling magnetic field Hin1 in the element pattern 15A are equal to the magnetization J51B, the anisotropic magnetic field Hk2 and the exchange-coupling magnetic field Hin2 in the element pattern 15B, respectively. FIGS. 5A and 5B are explanatory drawings for explaining the direction and magnitude of the magnetization, and the direction and magnitude of the magnetic field in the element patterns 15A and 15B, respectively.

The magnetic sensor 1 can be suitably used for detecting extremely minute magnetic fields (the magnetic field Hm to be detected) such as geomagnetism. The following is made of the case of detecting the magnetic field Hm to be rotated in the XY plane. For example, when measuring geomagnetism, the integrated substrate 100 may be positioned parallel to the ground.

In the element patterns 15A and 15B, the respective stacked surfaces are formed so as to be parallel to the plane of rotation of the magnetic field Hm to be detected. For example, when the magnetic field Hm to be detected is applied to the element pattern 15A, as shown in FIG. 5A, the magnetization J53A of the free layer 53A is changed to the direction of a composite vector V1 resulting from the composite magnetic field H1 and the magnetic field Hm to be detected. At this time, the angle between the magnetization J51A and the magnetization J53A is greater than the angle α1, and therefore a resistance value R1 of the first MR element 11A is increased. On the other hand, the magnetic field Hm to be detected in the same direction as in FIG. 5A is also applied to the element pattern 15B, as shown in FIG. 5B, and therefore the magnetization J53B of the free layer 53B is changed to the direction of a composite vector V2 resulting from the composite magnetic field H2 and the magnetic field Hm to be detected. At this time, the angle between the magnetization J51B and the magnetization J53B is smaller than the angle α2, and therefore a resistance value R2 of the second MR element 11B is decreased. Thus, the resistance value R1 of the first MR element 11A and the resistance value R2 of the second MR element 11B are configured to exhibit changes in the opposite directions to each other.

Figure 6:
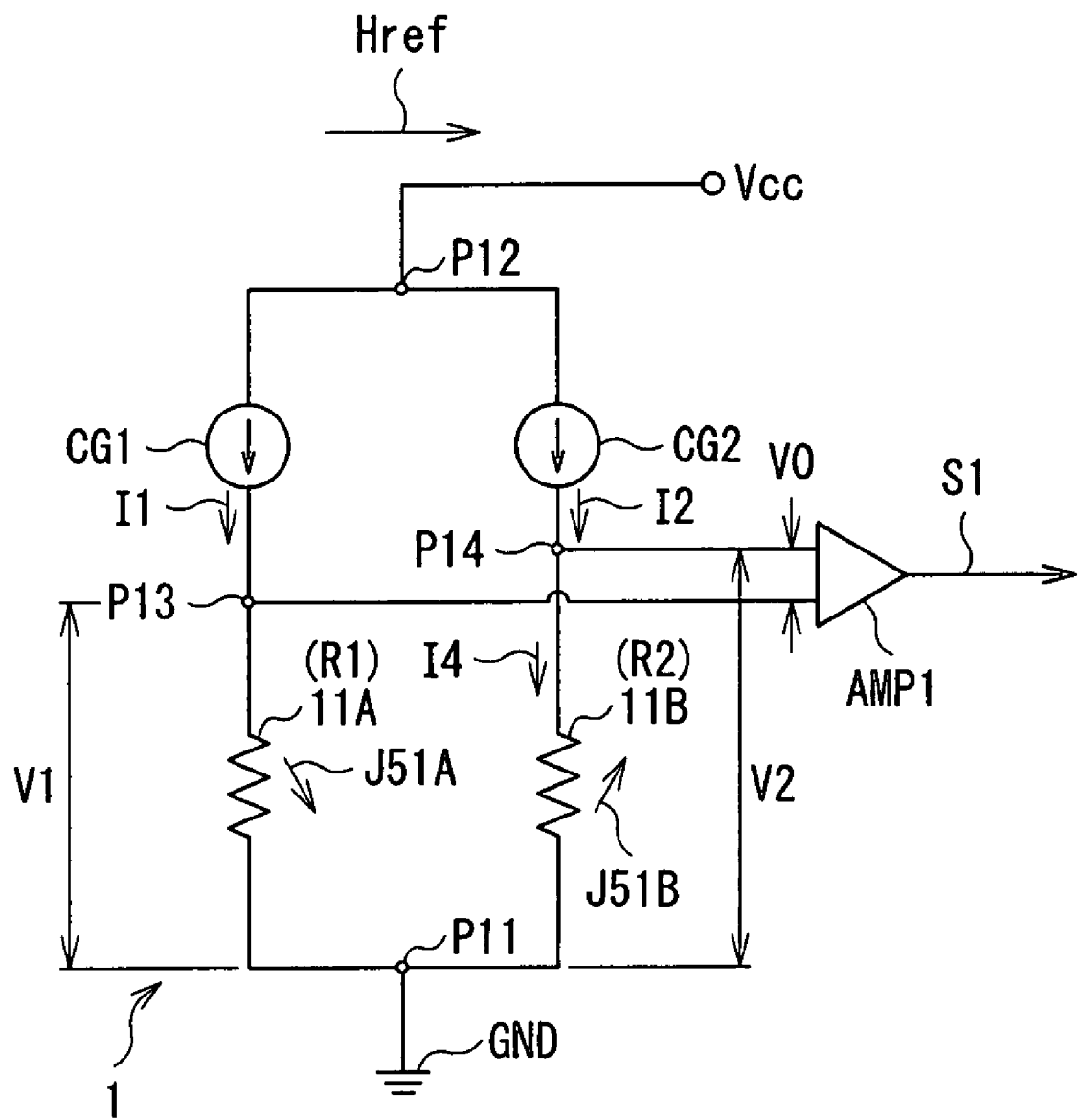
FIG. 6 is a circuit diagram showing the circuit configuration of the magnetic sensor shown in FIG. 1.

FIG. 6 is a schematic diagram showing the circuit configuration of the magnetic sensor 1.

The first module 10 has a constant current source CG1 (not shown in FIG. 1) formed on the element substrate 12, and the second module 20 has a constant current source CG2 (not shown in FIG. 1) formed on the element substrate 22. These constant current sources CG1 and CG2 configure the circuit as shown in FIG. 6, together with the first and the second MR elements 11A and 11B. One end of the first MR element 11A and one end of the second MR element 11B (for example, the electrodes 13A and 13B) are connected to each other at a first connecting point P11, and one end of the constant current source CG1 and one end of the constant current source CG2 are connected to each other at a second connecting point P12. The other end of the first MR element 11A (the electrode 14A on the opposite side of the first connecting point P12) is connected to the other end of the constant current source CG1 (the end portion on the opposite side of the second connecting point P11) at a third connecting point P13. The other end of the second MR element 11B (the electrode 14A on the opposite side of the first connecting point P11) is connected to the other end of the constant current source CG2 (the end portion on the opposite side of the second connecting point P12) at a fourth connecting point P14. The constant current source CG1 is configured to supply a constant current I1 to the first MR element 11A, and the constant current source CG2 is configured to supply a constant current I2 to the second MR element 11B.

The first module 10 further includes a difference detector AMP1 connected, on the input side, to the third connecting P13 and the fourth connecting point 14, respectively. The difference detector AMP1 detects a potential difference between the third connecting point P13 and the fourth connecting point P14 when a voltage is applied to between the first connecting point P11 and the second connecting point P12 (i.e. a difference between the voltage drop occurred in the first MR element 11A and that in the second MR element 11B), and then outputs the potential difference as a differential signal S1.

A method of manufacturing the magnetic sensor 1 will be described below.

Firstly, a plurality of MR elements are formed, in a batch, on a surface of a substrate (not shown) such as a silicon wafer. Specifically, a plurality of element patterns 15 made up of a free layer 53, a intermediate layer 52 and a pinned layer 51 are formed by stacking in order on the substrate a first ferromagnetic layer formed of a soft magnetic material such as NiFe, a intermediate layer formed of a non-magnetic conductive material such as copper, and a second ferromagnetic layer formed of a material (for example, CoFe) having greater coercive force than the first ferromagnetic layer, followed by patterning in a predetermined dimension. The plurality of MR elements can be then obtained by forming connecting portions 16 for connecting a predetermined number of element patterns 15, and forming electrodes 13 and 14 so as to be connected to the connecting portions 16 located at both ends. At this time, the direction of an anisotropic magnetic field Hk of the free layer 53 can be set by forming the first ferromagnetic layer while applying a magnetic field in a certain direction. With regard to the pinned layer 51, fixing, in a batch, (regularization) of the direction of magnetization J51 is performed so as to be different from the anisotropic magnetic field Hk. Specifically, the setting, in a batch, of the direction of the magnetization J51 is performed by, for example, annealing at a temperature of not less than 250° C. nor more than 400° C. for about four hours, while applying a magnetic field having a magnitude of not less than 1.6 kA/m nor more than 160 kA/m in a direction different from the anisotropic magnetic field Hk (so as to form a relative angle of greater than 0° and less than 90°). This regularization process determines the angles of the magnetization J51 of the pinned layer 51 and the magnetization J53 of the free layer 53 in the initial condition where the external magnetic field is zero.

Then, a first module 10 where a first MR element 11A is formed on an element substrate 12, and a second module 20 where a second MR element 11B is formed on an element substrate 22 are obtained by cutting per MR element the plurality of MR elements formed on the substrate, along with the substrate. Meanwhile, the relative angle between the magnetization J51 and the magnetization J53 may have somewhat variations even if these are the MR elements formed on the same substrate. However, between the MR elements formed in closer regions, the variations become relatively small. Therefore, in the manufacturing of the magnetic sensor 1, it is desirable to combine the MR elements selected from the narrowest region possible. The obtained first and second modules 10 and 20 are then stuck to the integrated substrate 100 so as to have a rotationally symmetrical position to each other around an axis parallel to the direction of the anisotropic magnetic fields Hk1 and Hk2 of the free layers 53A and 53B. At this time, for example, the first module 10 is stuck to one surface of the integrated substrate 100, and the second module 20 is stuck to the other surface. This enables the resistance values R1 and R2 to exhibit changes in opposite directions, depending on the magnetic field Hm to be detected.

After both surfaces of the integrated substrate 100 are covered with an insulating resin, a coil 30 is provided so as to wind around the first and the second modules 10 and 20. For example, an extra fine wire formed of copper (approximately φ 30 μm) is wound to form the coil 30. Finally, predetermined processes of forming constant current sources CG1 and CG2, and wiring are performed to complete the magnetic sensor 1.

The following is a method where the magnetic sensor 1 thus configured is used to detect the magnetic field Hm to be detected, based on a differential signal S1.

As a preparatory step of detecting the magnetic field Hm to be detected, by passing a refresh current through the coil 30, a refresh magnetic field Href (refer to FIGS. 5A and 5B, and FIG. 6) having at least the magnitude of a magnetic field, at which the magnetizations of the free layers 53A and 53B are saturated, is temporarily applied to the first and the second MR elements 11A and 11B along the directions of the anisotropic magnetic fields Hk1 and Hk2, respectively. This enables the directions of the magnetizations J53A and J53B to be reset to the initial condition. That is, the directions of the magnetizations J53A and J53B can be temporarily lined up in the same direction (the directions of the anisotropic magnetic fields Hk1 and Hk2). This avoids any detection error due to the hysteresis phenomenon of the first and the second MR elements 11A and 11B. Further, by temporarily applying the refresh magnetic field Href along the directions of the anisotropic magnetic fields Hk1 and Hk2, the crystal magnetic anisotropy of the free layers 53A and 53B can be stabilized (by which the anisotropic magnetic fields Hk1 and Hk2 can be also stabilized), so that the output of the magnetic sensor 1 can be stable at a high level.

In FIG. 6, assuming that when a predetermined voltage is applied to between the first connecting point P11 and the second connecting point P12, the constant currents from the constant current sources CG1 and CG2 are I1 and I2, respectively, and the resistance values of the first and the second MR elements 11A and 11B are R1 and R2, respectively. When the magnetic field Hm to be detected is not applied, voltage V1 at the third connecting point P13 is:

$$V1 = I1 \cdot R1$$

And voltage V2 at the fourth connecting point P14 is:

$$V2 = I2 \cdot R2$$

Accordingly, the potential difference between the third connecting point P13 and the fourth connecting point P14 is:

$$V0 = V1 - V2 \quad (1)$$
$$= I1 \cdot R1 - I2 \cdot R2$$

Here, when the constant current I1 and the constant current I2 are equal to each other (i.e. I1=I2=I0), the equation (1) is transformed as follows:

$$V0 = I0 \cdot (R1 - R2) \quad (2)$$

In this circuit, the variation of resistance can be obtained by measuring the potential difference V0 when the magnetic field Hm to be detected is applied. For example, assuming that when the magnetic field Hm to be detected is applied, the resistance values R1 and R2 are increased by the variations $\Delta R1$ and $\Delta R2$, respectively, the equation (2) is transformed as follows:

$$V0 = V1 - V2 \quad (3)$$
$$= I0 \cdot (R1 - R2)$$
$$= I0 \cdot \{(R1 + \Delta R1) - (R2 + \Delta R2)\}$$

As described above, the first and the second MR elements 11A and 11B are arranged to exhibit changes of the resistance values R1 and R2 in opposite directions to each other by the magnetic field Hm to be detected, and therefore the variations $\Delta R1$ and $\Delta R2$ are reversed in the positive and negative signs. Accordingly, in the equation (3), the resistance value R1 and the resistance value R2, which are obtained before the magnetic field Hm to be detected is applied, cancel each other, whereas the variations $\Delta R1$ and $\Delta R2$ remain unchanged.

Provided that the first and the second MR elements 11A and 11B have the same characteristic, that is, $$R1=R2=R$$

and $$\Delta R1=-\Delta R2=\Delta R$$

The equation (3) is transformed as follows:

$$V0 = I0 \cdot (R1 + \Delta R1 - R2 - \Delta R2) \quad (4)$$
$$= I0 \cdot (R + \Delta R - R + \Delta R)$$
$$= I0 \cdot (2\Delta R)$$

Accordingly, the magnitude of the magnetic field Hm to be detected can be measured by using the first and the second MR elements 11A and 11B, each having the known relationship between the external magnetic field and the variation of resistance. The potential difference V0 expressed by the equation (4) can be determined by the angle formed between the composite vectors V1 and V2, and the magnetizations J51A and J51B.

Unless the angle $\alpha 1$ between the magnetization J51A and the composite magnetic field H1 is coincident with the angle $\alpha 2$ between the magnetization J51B and the composite magnetic field H2, an offset output will occur in the initial condition, which is the previous stage of measuring the magnetic field Hm to be detected (V0=0 cannot be established in the equation (2)). This is because even in the unloaded condition where the magnetic field Hm to be detected is not applied, the difference between the resistance value R1 of the first MR element 11A and the resistance value R2 of the second MR element 11B will not become zero.

According to the first preferred embodiment, in the first and the second MR elements 11A and 11B, the direction of the anisotropic magnetic field Hk1 and the direction of the anisotropic magnetic field Hk2 are coincident with each other, and these elements have rotationally symmetrical relationship with each other around the central axis CL parallel to the anisotropic magnetic fields Hk1 and Hk2. Hence, the angle $\alpha 1$ and the angle $\alpha 2$ are substantially equal. Further, since the first and the second MR elements 11A and 11B are formed, in a batch, these have substantially the identical performance. This minimizes the offset output.

Figure 22:
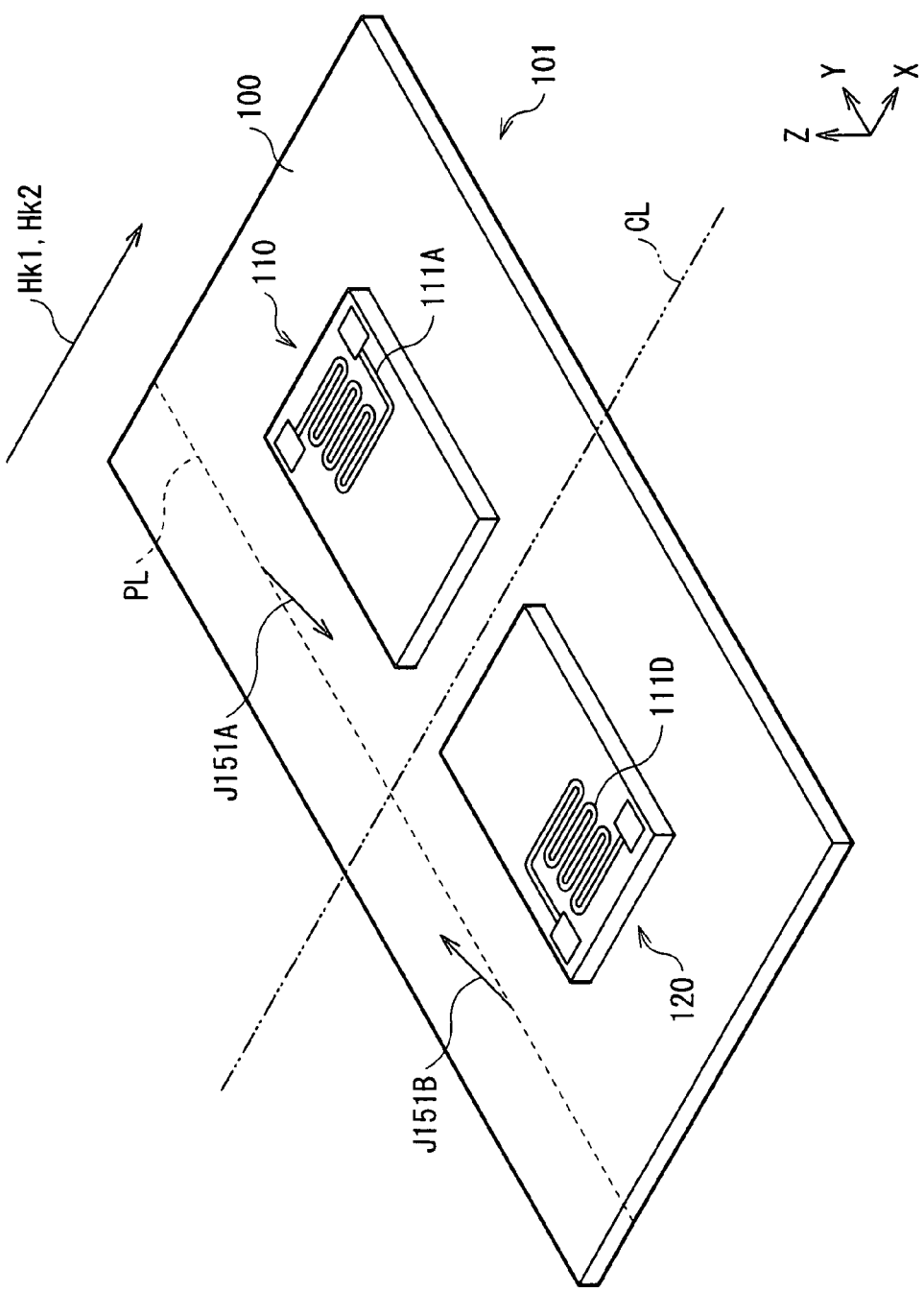
FIG. 22 is a perspective view showing the configuration of a magnetic sensor as a comparative example.
Figure 23A:
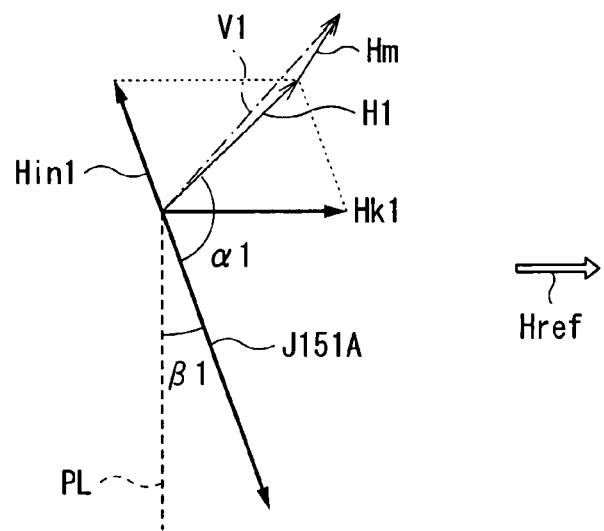
FIGS. 23A and 23B are explanatory drawings for explaining the relationship between the magnetization direction and the magnetic field direction in the magnetic sensor as a comparative example.
Figure 23B:
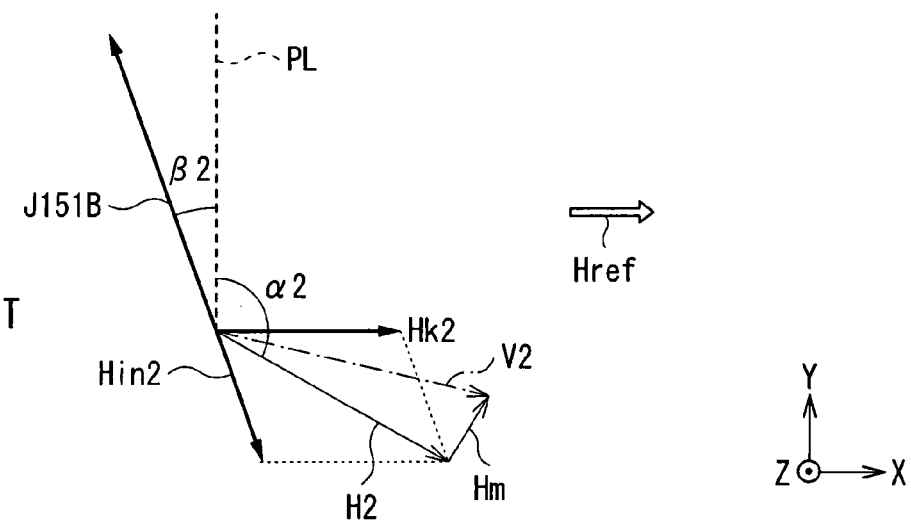

On the other hand, the offset output may be relatively large when a first MR element 111A configuring a first module 110 and a second MR element 111B configuring a second module 120 do not have the rotationally symmetrical relationship with each other around the central axis CL, as in a magnetic sensor 101 as a comparative example shown in FIG. 22 and FIGS. 23A and 23B. FIG. 22 is a schematic view showing the perspective configuration of the magnetic sensor 101 as a comparative example to the magnetic sensor 1 of the present embodiment. FIGS. 23A and 23B are explanatory drawings for explaining the relationship between the magnetization direction and the magnetic field direction in individual element patterns (not shown) included in the first and the second MR elements 111A and 111B. In the magnetic sensor 101, the first MR element 111A and the second MR element 111B have a rotationally symmetrical relationship with each other around an axis orthogonal to a plane (the XY plane) including the anisotropic magnetic fields Hk1 and Hk2. In this case, the direction of a magnetization J151A and the direction of a magnetization J151B may be inclined in opposite directions around an orthogonal axis PL, namely inclined in directions apart from each other (refer to FIG. 22). Therefore, the angle between the direction of the magnetization J151A and the direction of the anisotropic magnetic field Hk1 is less than 90° (refer to FIG. 23A), whereas the angle between the direction of the magnetization J151B and the direction of the anisotropic magnetic field Hk2 exceeds 90° (refer to FIG. 23B). That is, when the first and the second MR elements 111A and 111B are not rotationally symmetric, the angle $\alpha 1$ and the angle $\alpha 2$ are greatly different from each other even if the angle $\alpha 1$ and the angle $\alpha 2$ are substantially equal. Consequently, a relatively large offset output appears when the first and the second MR elements 111A and 111B are arranged as in the magnetic sensor 101.

As described above, the magnetic sensor 1 of the first preferred embodiment is configured so that the first and the second MR elements 11A and 11B have the rotationally symmetrical relationship with each other around the central axis CL parallel to the directions of the anisotropic magnetic fields Hk1 and Hk2 of the free layers 53A and 53B. Therefore, in the initial condition, the relative angle $\alpha 1$ between the direction of the magnetization J53A and the direction of the magnetization J51A is equal to the relative angle $\alpha 2$ between the direction of the magnetization J53B and the direction of the magnetization J51B. Additionally, in accordance with the magnetic field Hm to be detected, the resistance value R1 of the first MR element 11A and the resistance value R2 of the second MR element 11B exhibit the changes in opposite directions to each other. This enables a reduction of the offset output due to an error between the relative angles $\alpha 1$ and $\alpha 2$, thus permitting higher-precision measurement of the magnetic field Hm to be detected.

Further, the coil 30 is provided to apply the refresh magnetic field Href to the first and the second MR elements 11A and 11B in the directions of the anisotropic magnetic fields Hk1 and Hk2, in order to saturate the free layers 53A and 53B. Therefore, even if the directions of the magnetizations J53A and J53B of the free layers 53A and 53B are disturbed by any unnecessary magnetic field from the exterior (the disturbance magnetic field), these directions can be temporarily lined up in a certain direction (the directions of the composite magnetic fields H1 and H2). Furthermore, applying the refresh magnetic field Href can also stabilize the directions of the anisotropic magnetic fields Hk1 and Hk2. Hence, even micro magnetic fields of the order to geomagnetism can be detected stably with high precision, by detecting the magnetic field Hm to be detected after the refresh magnetic field Href is applied to the first and the second MR elements 11A and 11B.

Additionally, in the first preferred embodiment, all of the formed, in a batch, plurality of MR elements on the same substrate are regularized in a batch so that the axis of easy magnetization of the first ferromagnetic layer and the magnetization direction of the second ferromagnetic layer are different from each other. Thereafter, the first and the second MR elements 11A and 11B cut from the substrate are arranged on the integrated circuit 100. This minimizes the error between the angles α1 and α2, and the errors of performances such as sensitivity in the first and the second MR elements 11A and 11B.

Second Preferred Embodiment

Figure 7:
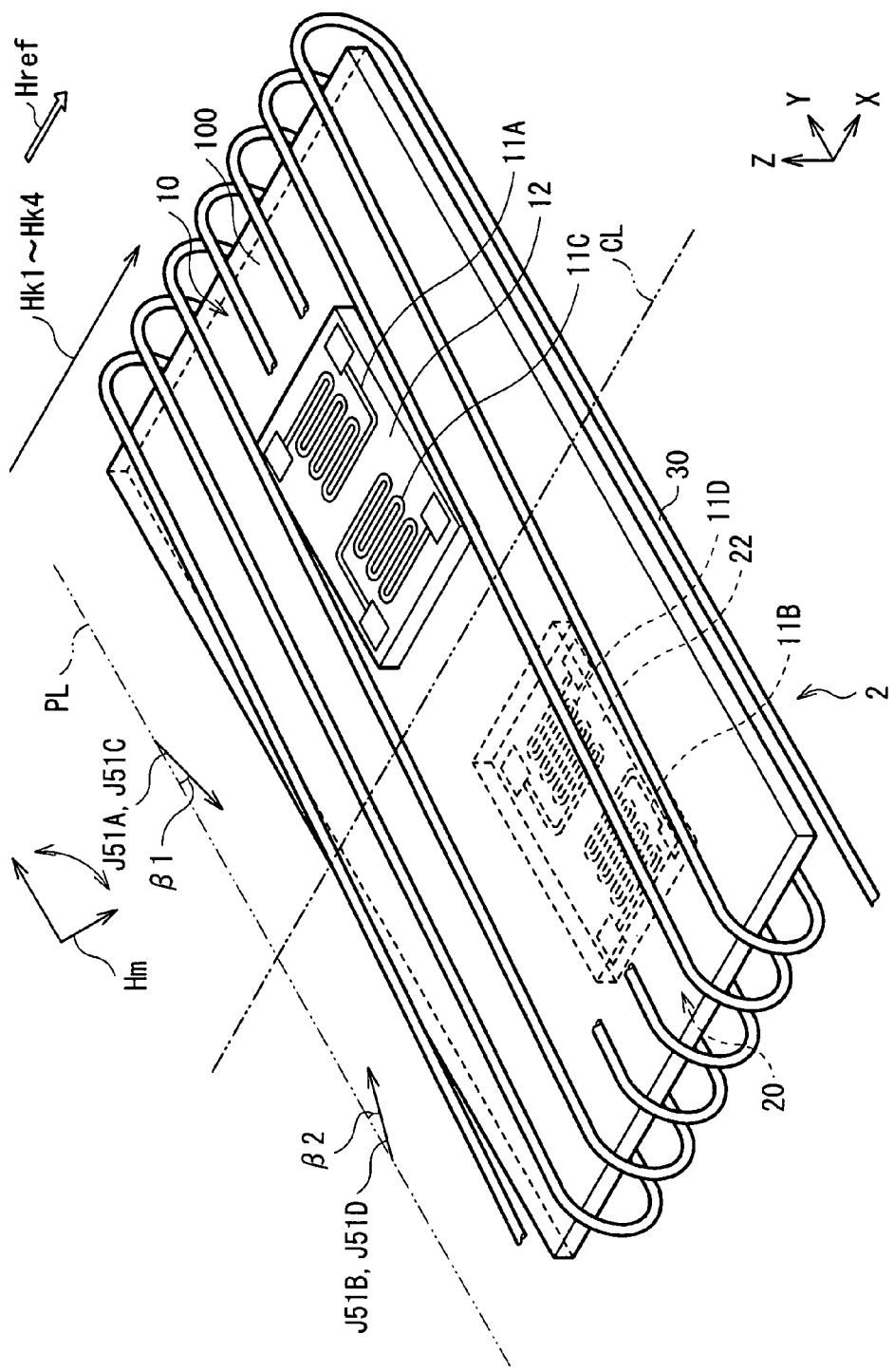
FIG. 7 is a perspective view showing the configuration of a magnetic sensor as a second preferred embodiment in the present invention.
Figure 8A:
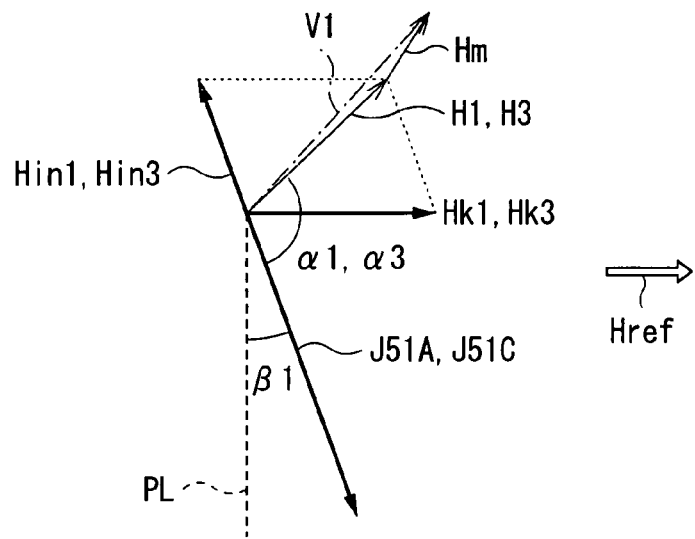
FIGS. 8A and 8B are explanatory drawings for explaining the relationship between the magnetization direction and the magnetic field direction in key parts of first to fourth MR elements shown in FIG. 7, respectively.
Figure 8B:
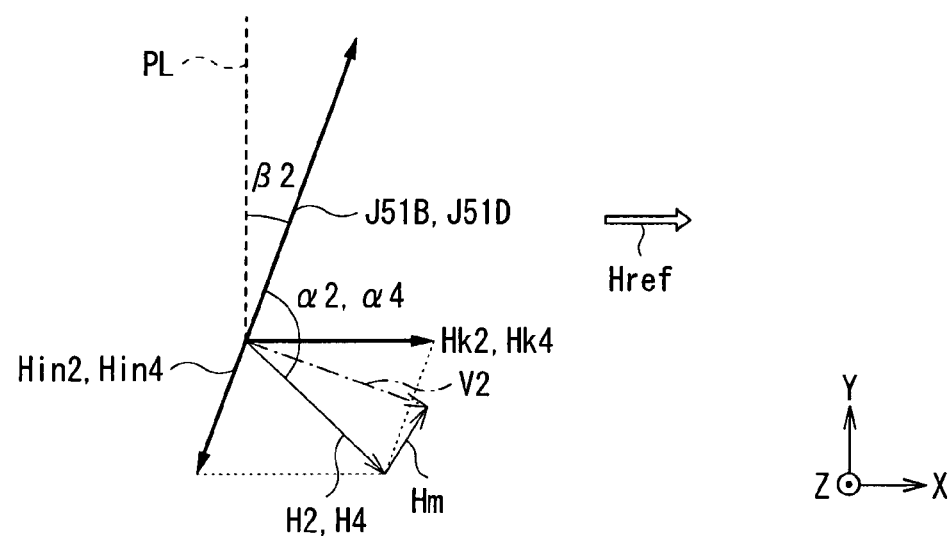
Figure 9:
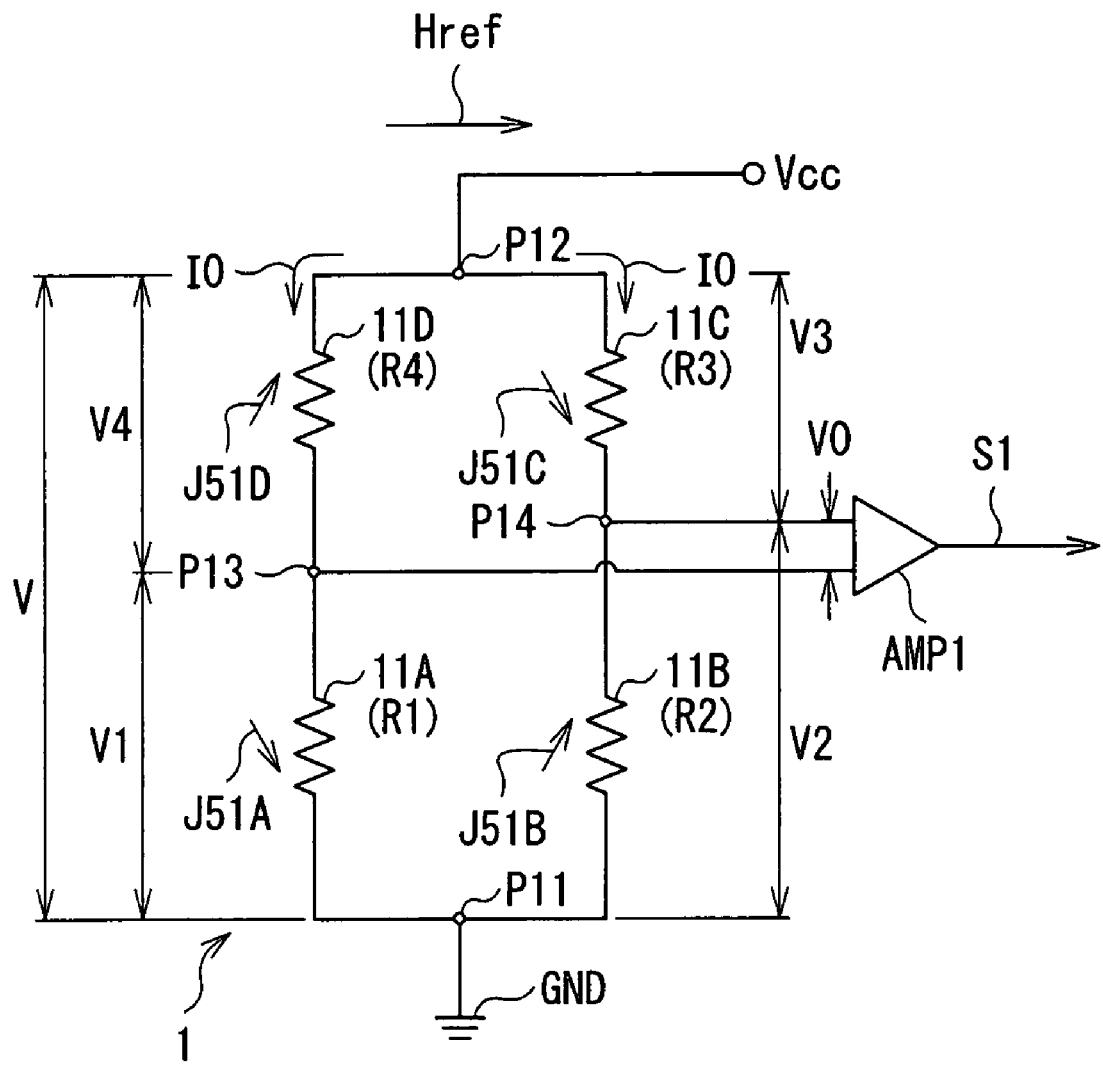
FIG. 9 is a circuit diagram showing the circuit configuration of the magnetic sensor shown in FIG. 7.

A magnetic sensor as a second preferred embodiment in the present invention will be described with reference to FIGS. 7 to 9. FIG. 7 is a schematic diagram showing the perspective configuration of a magnetic sensor 2 of the present embodiment. FIGS. 8A and 8B are explanatory drawings for explaining the conditions of the magnetization direction and the magnetic field direction in a key part of the magnetic sensor 2. FIG. 9 is a circuit diagram corresponding to the magnetic sensor 2.

The foregoing first preferred embodiment has described the magnetic sensor 1 configured by the first and the second MR elements 11A and 11B. The second preferred embodiment will describe the magnetic sensor 2 configured by first to fourth MR elements 11A to 11D. In the following, different points from the magnetic sensor 1 will be described, with other points omitted.

As shown in FIG. 7, the magnetic sensor 2 is configured so that a first module 10 has a first MR element 11A and a third MR element 11C on an element substrate 12, and a second module 20 has a second MR element 11B and a fourth MR element 11D on an element substrate 22. The third and fourth MR elements 11C and 11D have the same configuration as the first and the second MR elements 11A and 11B. That is, the first and the third MR elements 11A and 11C have a relationship of being equivalent to each other, and the second and the fourth MR elements 11B and 11D have a relationship of being equivalent to each other. Therefore, the second and the fourth MR elements 11B and 11D have a rotationally symmetric relationship with the first and the third MR elements 11A and 11C around a central axis CL. The third MR element 11C is provided with a plurality of element patterns 15C (not shown), each having a pinned layer 51C, a intermediate layer 52C and a free layer 53C, which correspond to the pinned layer 51A, the intermediate layer 52A and the free layer 53A, respectively. The fourth MR element 11D is provided with a plurality of element patterns 15D (not shown), each having a pinned layer 51D, a intermediate layer 52D and a free layer 53D, which correspond to the pinned layer 51B, the intermediate layer 52B and the free layer 53B, respectively. As shown in FIG. 8A, the direction of a magnetization J51C of the pinned layer 51C is pinned in a direction to incline at an angle β1 from an orthogonal axis PL, as in the magnetization J51A. Therefore, in the third MR element 11C, an exchange-coupling magnetic field Hin3 coincident with the exchange-coupling magnetic field Hin1 is generated to form a composite magnetic field H3 coincident with the composite magnetic field H1. In the unloaded condition, a magnetization J51C of the free layer 53C is directed to the direction of a composite magnetic field H3. On the other hand, as shown in FIG. 8B, a magnetization J51D of the pinned layer 51D is pinned at a direction inclined at an angle β2 from the orthogonal axis PL, as in the magnetization J51B. Therefore, in the fourth MR element 11D, an exchange-coupling magnetic field Hin4 coincident with the exchange-coupling magnetic field Hin2 is generated to form a composite magnetic field H4 coincident with the composite magnetic field H2. In the unloaded condition, a magnetization J51D of the free layer 53D is directed to the direction of a composite magnetic field H4. In the magnetic sensor 2, all of the angle α1 between the magnetization J51A and the magnetization J53A, the angle α2 between the magnetization J51B and the magnetization J53B, the angle α3 between the magnetization J51C and the magnetization J53C, and the angle α4 between the magnetization J51D and the magnetization J53D are equal in the unloaded condition.

The circuit configuration of the magnetic sensor 2 is as shown in FIG. 9. Here, a bridge circuit is formed by the following connections. That is, one end of the first MR element 11A and one end of the second MR element 11B are connected to each other at a first connecting point P11. One end of the third MR element 11C and one end of the fourth MR element 11D are connected to each other at a second connecting point P12. The other end of the first MR element 11A is connected to the other end of the fourth MR element 11D at a third connecting point P13. The other end of the second MR element 11B is connected to the other end of the third MR element 11C at a fourth connecting point P14.

In the magnetic sensor 2, in accordance with the change of a magnetic field Hm to be detected, the third and fourth MR elements 11C and 11D exhibit the same behavior as the first and the second MR elements 11A and 11B, respectively.

In FIG. 9, assuming that when a predetermined voltage is applied to between the first connecting point P11 and the second connecting point P12, the constant current is I0, and the resistance values of the first to the fourth MR elements 11A to 11D are R1 to R4, respectively. When the magnetic field Hm to be detected is not applied, a potential difference V between the second connecting point P12 and the first connecting point P11 can be expressed as follows:

$$V = I1 \cdot R4 + I1 \cdot R1 \quad (5)$$
$$= I2 \cdot R3 + I2 \cdot R2$$
$$= I1(R4 + R1)$$
$$= I2(R3 + R2)$$

where R1 to R4 are resistance values of the first to the fourth MR elements 11A to 11D, respectively.

Potential V1 at the third connecting point P13 and potential V2 at the fourth connecting point P14 can be expressed as follows:

$$V1 = V - V4$$
$$= V - I1 \cdot R4$$
$$V2 = V - V3$$
$$= V - I2 \cdot R3$$

Accordingly, the potential difference V0 between the third and fourth connecting points P13 and P14 is:

$$V0 = V1 - V2 \qquad (6)$$
$$= (V - I1 \cdot R4) - (V - I2 \cdot R3)$$
$$= I2 \cdot R3 - I1 \cdot R4$$

From the equation (5), the following equation is obtained:

$$V0 = R3/(R3 + R2) \cdot V - R4/(R4 + R1) \cdot V \qquad (7)$$
$$= \{R3/(R3 + R2) - R4/(R4 + R1)\} \cdot V$$

In this bridge circuit, the variation of resistance can be obtained by measuring the voltage V0 between the third and fourth connecting points P13 and P14 expressed by the equation (7), when the magnetic field Hm to be detected is applied. Assuming that when the magnetic field Hm to be detected is applied, the resistance values R1 to R4 are increased by the variations ΔR1 to ΔR4, respectively, that is, the resistance values R1 to R4 are changed as follows:

R1 is changed to R1+ΔR1

R3 is changed to R2+ΔR2

R3 is changed to R3+ΔR3

R4 is changed to R4+ΔR4

From the equation (7), these resistance values after the magnetic field Hm to be detected is applied can be expressed as follows:

$$V0 = \{(R3+\Delta R3)/(R3+\Delta R3+R2+\Delta R2) - (R4+\Delta R4)/(R4+\Delta R4+R1+\Delta R1)\} \cdot V \qquad (8)$$

As described above, in the magnetic sensor 2, the resistance values R1 and R3 of the first and the third MR elements 11A and 11C, and the resistance values R2 and R4 of the second and the fourth MR elements 11B and 11D are changed in opposite directions. Therefore, the variation ΔR3 and the variation ΔR2 cancel each other, and the variation ΔR4 and the variation ΔR1 cancel each other. If a comparison is made before and after the magnetic field Hm to be detected is applied, there is little or no increase of the denominator in each term of the equation (8). On the other hand, as to the numerator of each item, the variation ΔR3 and the variation ΔR4 are sure to have the reverse sign, so that an increase or a decrease appears without cancellation. The reason for this is as follows. That is, by applying the magnetic field Hm to be detected, the resistance value can be changed (substantially decreased) by the variations ΔR2 and ΔR4 (ΔR2, ΔR4<0) in the second and the fourth MR elements 11B and 11D, respectively, and the resistance value can be changed (substantially increased) by the variations ΔR1 and ΔR3 (ΔR1, ΔR3>0) in the first and the third MR elements 11A and 11C, respectively.

In particular, the first to the fourth MR elements 11A to 11D are formed, in a batch, and have the same characteristic, that is,

R=R1=R2=R3=R4 and

ΔR=ΔR1=−ΔR2=ΔR3=−ΔR4

Therefore, the equation (8) is transformed as follows:

$$V0 = \{(R + \Delta R)/(2R) - (R - \Delta R)/(2R)\} \cdot V$$
$$= (\Delta R/R) \cdot V$$

Thus, the magnitude of the magnetic field Hm to be detected can be measured by using the first to the fourth MR elements 11A to 11D, each having the known relationship between the external magnetic field and the variation of resistance.

A method of manufacturing the magnetic sensor 2 is basically identical with the method of manufacturing the magnetic sensor 1 described in the first preferred embodiment. Firstly, a plurality of MR elements are formed, in a batch, on a surface of a substrate (not shown) such as a silicon wafer, and then cut by two MR elements along with the substrate. This results in a first module 10 where first and third MR elements 11A and 11C are formed on an element substrate 12, and a second module 20 where second and fourth MR elements 11B and 11D are formed on an element substrate 22. Thereafter, the first and the second modules 10 and 20 are stuck to an integrated substrate 100 so as to be a rotationally symmetric position with each other around an axis parallel to the directions of anisotropic magnetic fields Hk1 to Hk4 of the free layer. At this time, for example, the first module 10 is stuck to one surface of the integrated substrate 100, and the second module 20 is stuck to the other surface. This enables resistance values R1 and R3 and resistance values R2 and R4 to exhibit changes in opposite directions, depending on a magnetic field Hm to be detected. The magnetic sensor 2 can be then completed by passing through predetermined processes of covering both surfaces of the integrated substrate 100 with an insulating resin, and providing a coil 30 so as to wind around the first and the second modules 10 and 20.

Thus, the magnetic sensor 2 of the second preferred embodiment is configured that the first and the third MR elements 11A and 11C are arranged at the equivalent position, and the second and the fourth MR elements 11B and 11D have the rotationally symmetrical relationship with the first and the third MR elements 11A and 11C, around the central axis CL. Therefore, in the initial condition (the unloaded condition), all of the relative angles α1 to α4 are equal. Additionally, in accordance with the magnetic field Hm to be detected, the resistance values R1 and R3 of the first and the third MR elements 11A and 11C, and the resistance values R2 and R4 of the second and the fourth MR elements 11B and 11D exhibit the changes in opposite directions. This enables cancellation of the offset output due to errors in the relative angles α1 to α4, thus permitting higher-precision measurement of the magnetic field Hm to be detected.

EXAMPLES

Examples of the present invention will be described below.

Examples 1-1 to 1-4

The following measurements were made using the magnetic sensor 1 of the foregoing embodiment. That is, after applying the refresh magnetic field Href, the offset output voltage (mV) was measured in the unloaded condition without applying any external magnetic field H, ad the performance output voltage (mV) was measured as well with applying weak magnetic field Hm to be detected. Here, the dependences of the angle β of the offset output voltage and the performance output voltage were examined by controlling the angle β1 and the angle β2 so as to be the same angle β. The results are shown in FIGS. 10A, 11A, 12A, and 13A.

Figure 10A:
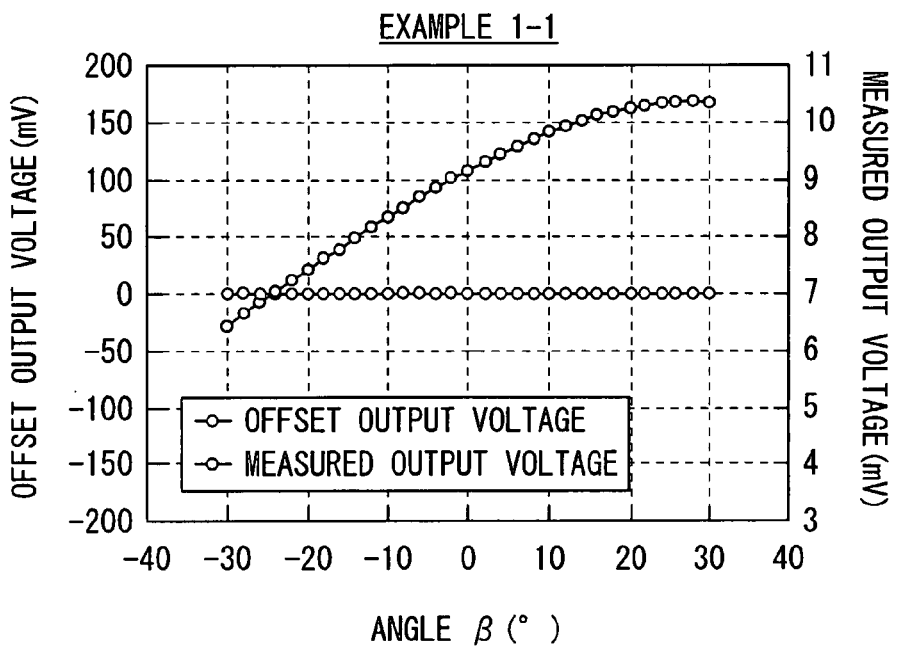
FIGS. 10A and 10B are characteristic diagrams showing the angle $\beta$ dependence of offset output voltage and performance output voltage in Example 1-1 and Comparative Example 1-1.
Figure 10B:
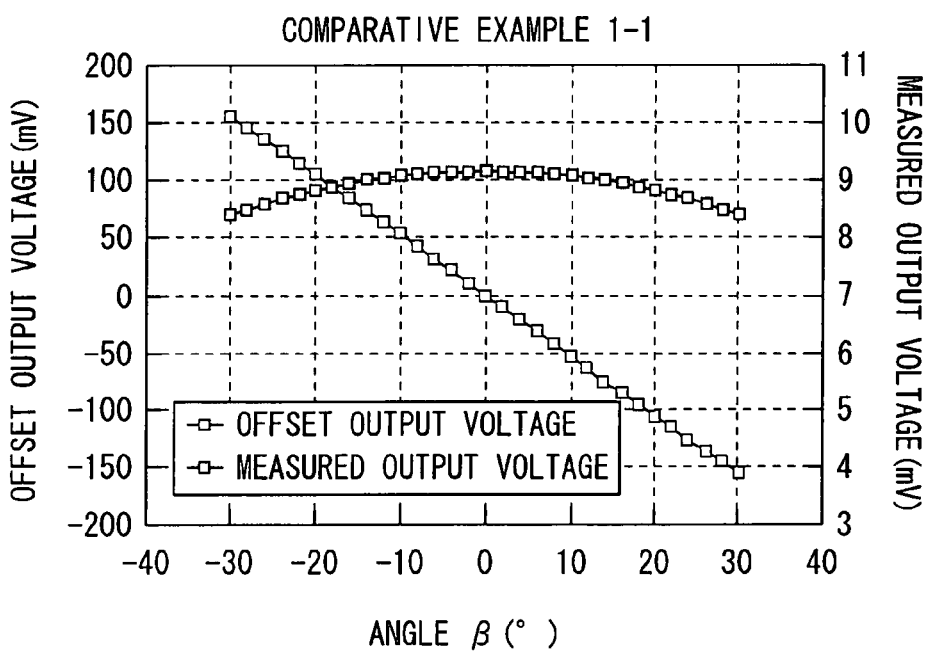
Figure 11A:
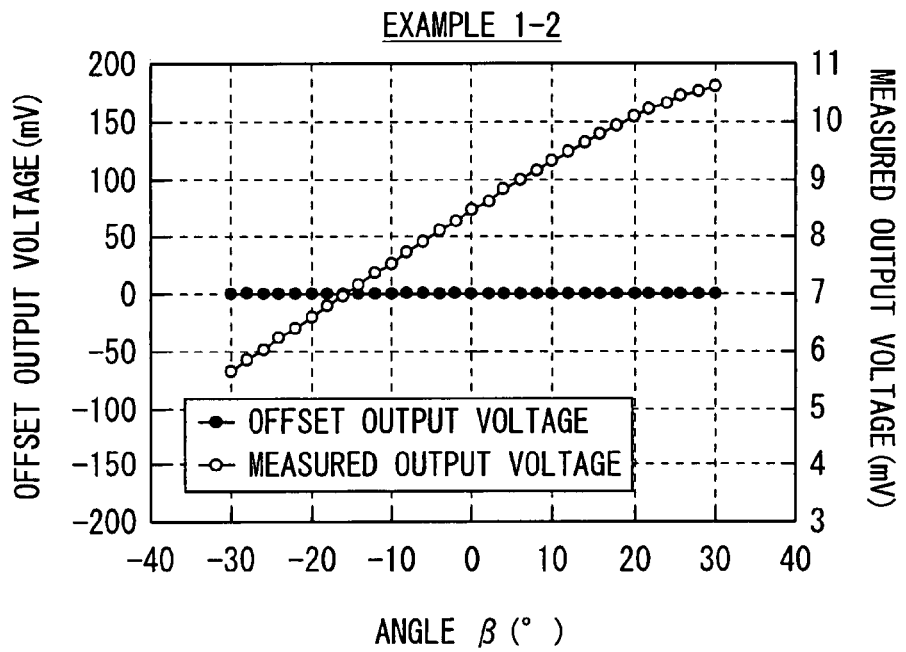
FIGS. 11A and 11B are characteristic diagrams showing the angle $\beta$ dependence of offset output voltage and performance output voltage in Example 1-2 and Comparative Example 1-.
Figure 11B:
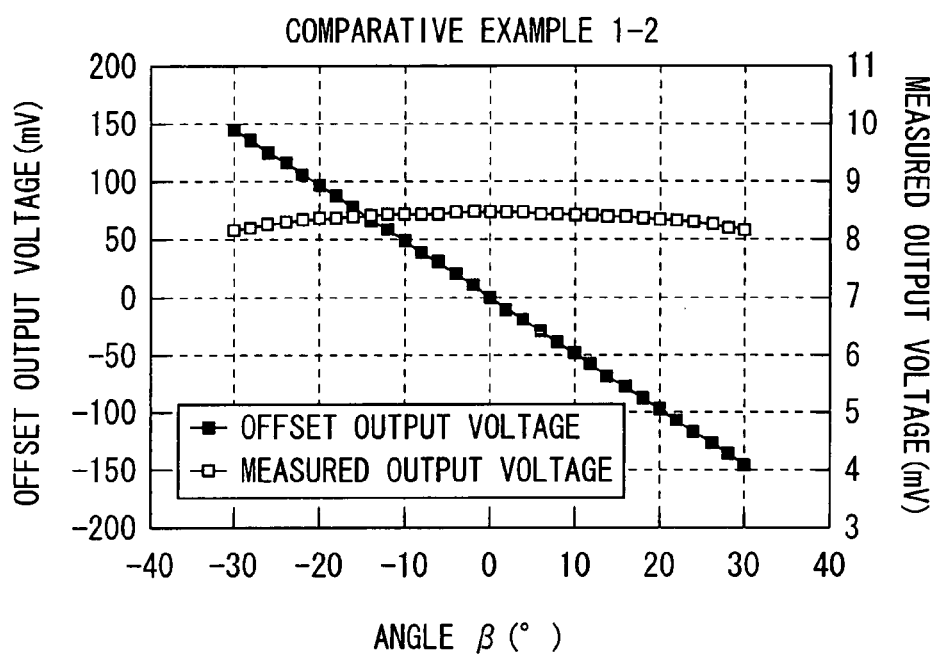
Figure 12A:
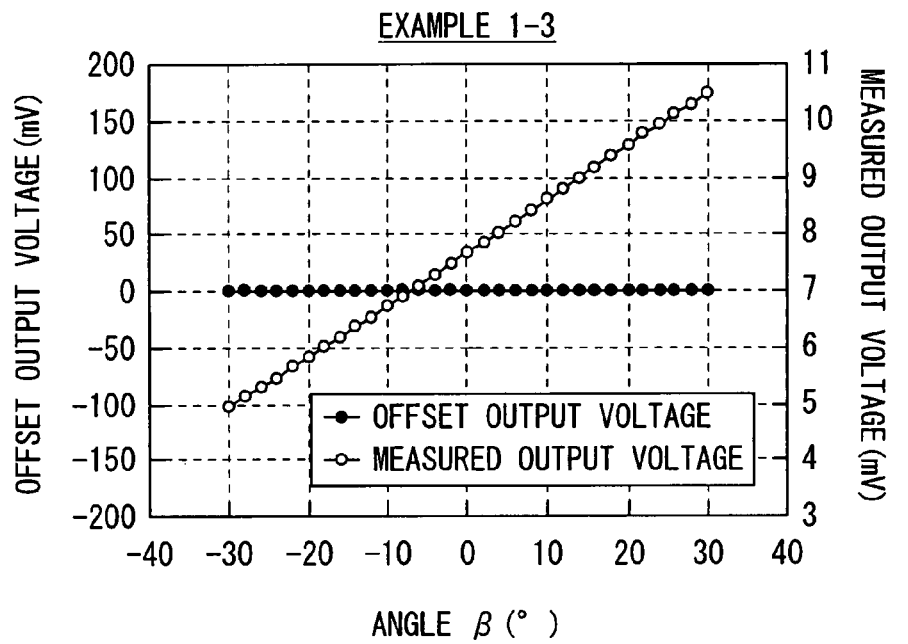
FIGS. 12A and 12B are characteristic diagrams showing the angle $\beta$ dependence of offset output voltage and performance output voltage in Example 1-3 and Comparative Example 1-3.
Figure 12B:
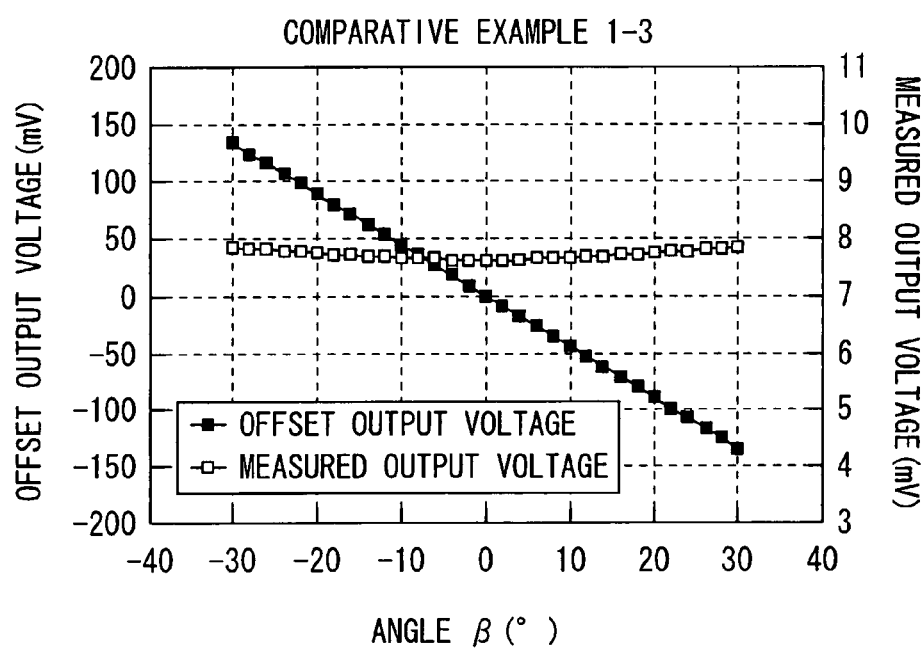
Figure 13A:
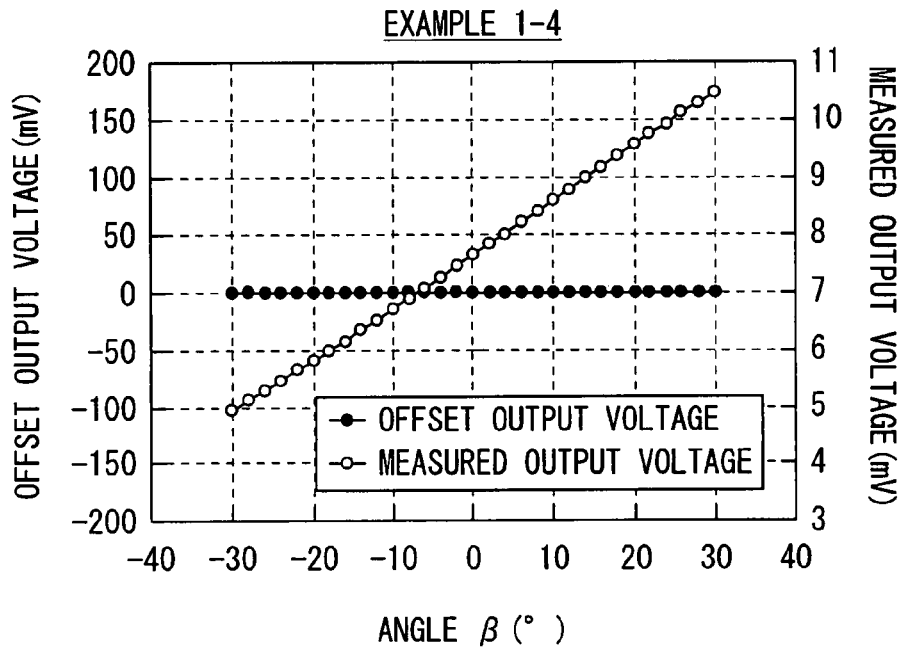
FIGS. 13A and 13B are characteristic diagrams showing the angle $\beta$ dependence of offset output voltage and performance output voltage in Example 1-4 and Comparative Example 1-4.
Figure 13B:
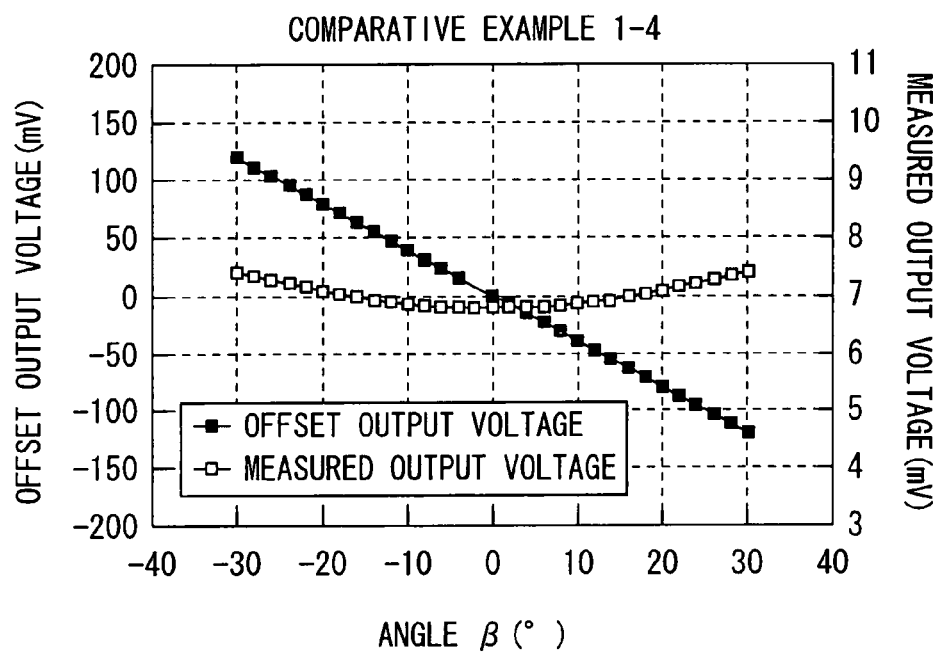

FIG. 10A shows the case where both of the exchange-coupling magnetic fields Hin1 and Hin2 are 4Oe (=(1/π)×10³ A/m), and both of the anisotropic magnetic fields Hk1 and Hk2 are 20Oe (=(5/π)×10³ A/m). FIG. 11A shows the case where both of the exchange-coupling magnetic fields Hin1 and Hin2 are 6Oe (=(1.5/π)×10³ A/m), and both of the anisotropic magnetic fields Hk1 and Hk2 are 20Oe (=(5/π)×10³ A/m). FIG. 12A shows the case where both of the exchange-coupling magnetic fields Hin1 and Hin2 are 8Oe (=(2/π)×10³ A/m), and both of the anisotropic magnetic fields Hk1 and Hk2 are 20Oe (=(5/π)×10³ A/m). FIG. 13A shows the case where both of the exchange-coupling magnetic fields Hin1 and Hin2 are 10Oe (=(2.5/π)×10³ A/m), and both of the anisotropic magnetic fields Hk1 and Hk2 are 20Oe (=(5/π)×10³ A/m). As Comparative Examples 1-1 to 1-4 corresponding to Examples 1-1 to 1-4, a magnetic sensor 2B shown in FIG. 19 was manufactured to conduct similar examinations. The results are shown in FIGS. 10B, 11B, 12B, and 13B.

As apparent from FIGS. 10A to 13B, it was confirmed that in Examples 1-1 to 1-4, the offset output voltage of almost zero were attained irrespective of the angle β. On the other hand, it was confirmed that in Comparative Examples 1-1 to 1-4, there were generated offset output voltages greatly depending on the angle β, and the performance output voltages had an extremely smaller change than Examples 1-1 to 1-4. That is, it was confirmed that in Examples 1-1 to 1-4, the generation of the offset output voltage could be sufficiently suppressed, thus enabling higher-precision measurement of the magnetic field Hm to be detected.

Examples 2-1 to 2-4

In the same manner as in Examples 1-1 to 1-4, the dependences of the angle β of the offset output voltage and the performance output voltage were examined on the magnetic sensor 1. The results are shown in FIGS. 14A, 15A, 16A, and 17A.

Figure 14A:
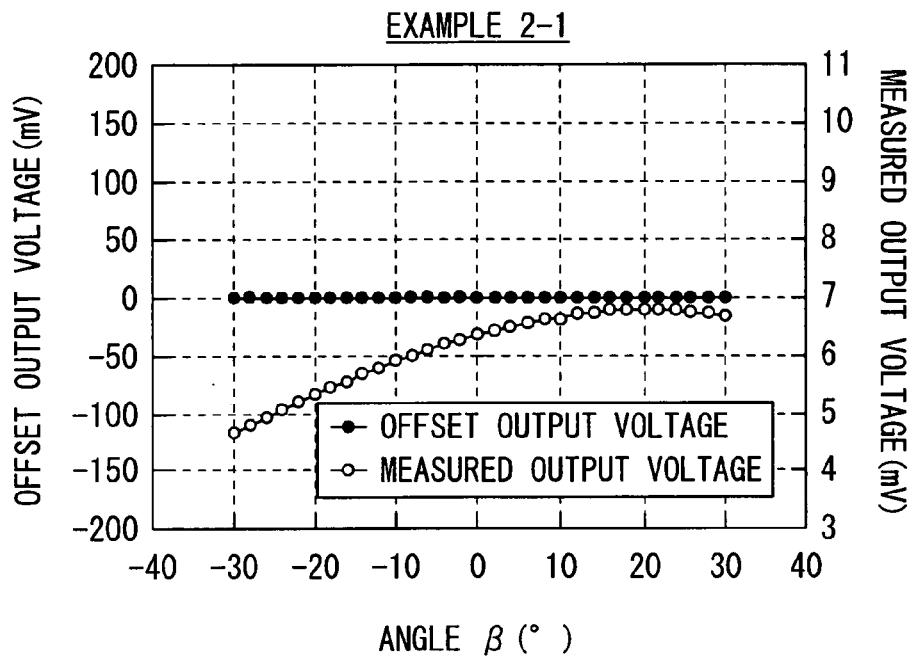
FIGS. 14A and 14B are characteristic diagrams showing the angle $\beta$ dependence of offset output voltage and performance output voltage in Example 2-1 and Comparative Example 2-1.
Figure 14B:
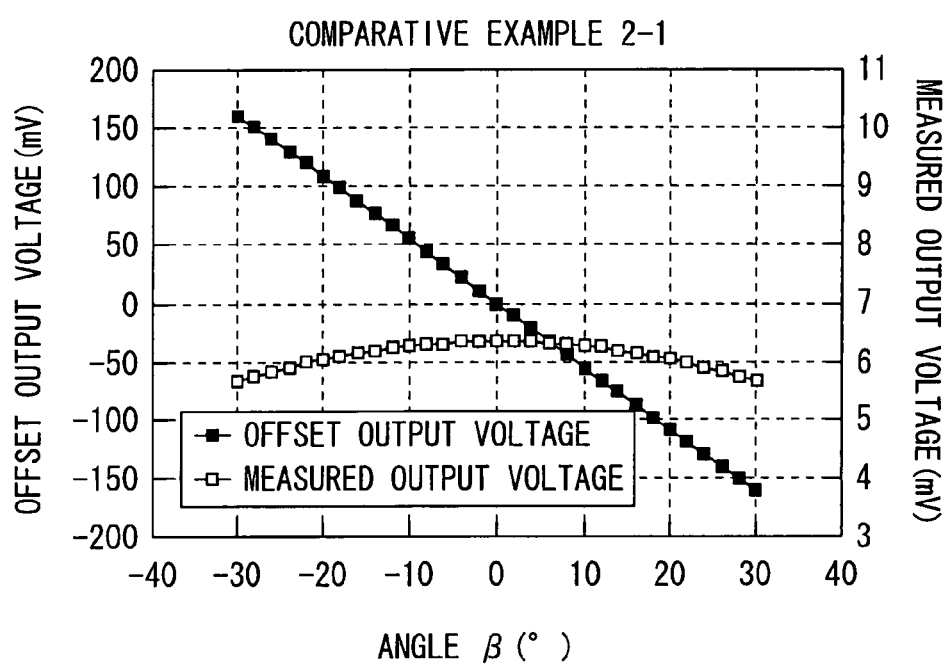
Figure 15A:
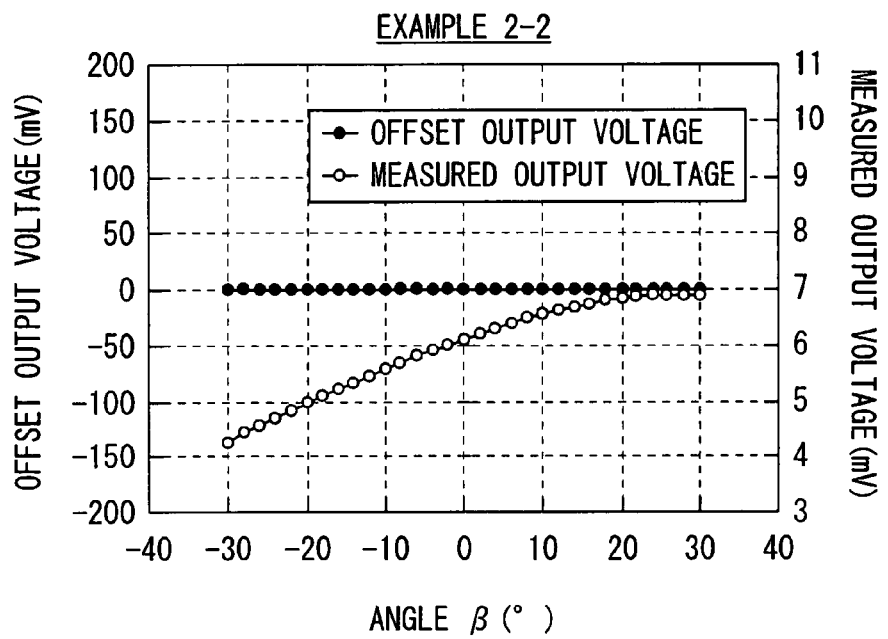
FIGS. 15A and 15B are characteristic diagrams showing the angle $\beta$ dependence of offset output voltage and performance output voltage in Example 2-2 and Comparative Example 2-2.
Figure 15B:
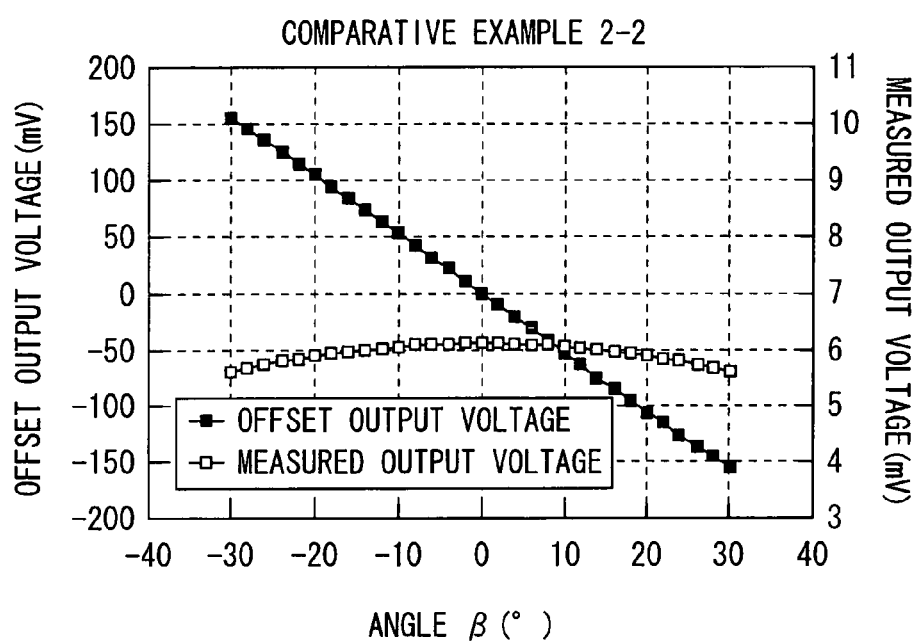
Figure 16A:
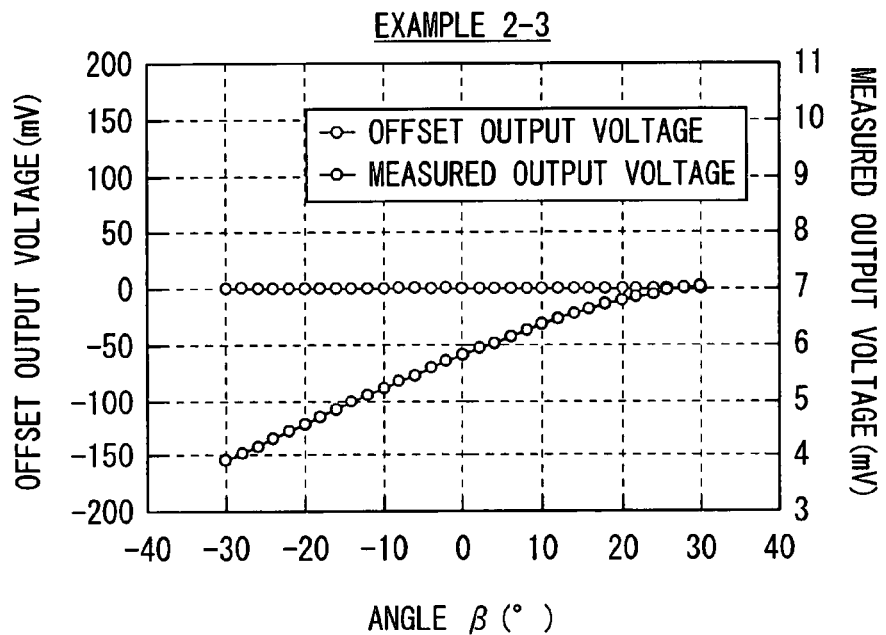
FIGS. 16A and 16B are characteristic diagrams showing the angle β dependence of offset output voltage and performance output voltage in Example 2-3 and Comparative Example 2-3.
Figure 16B:
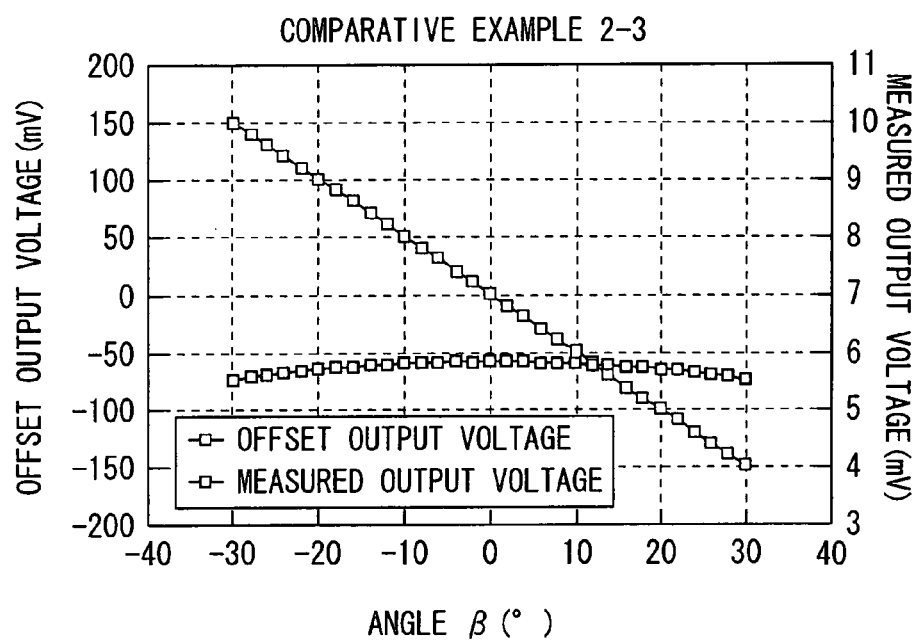
Figure 17A:
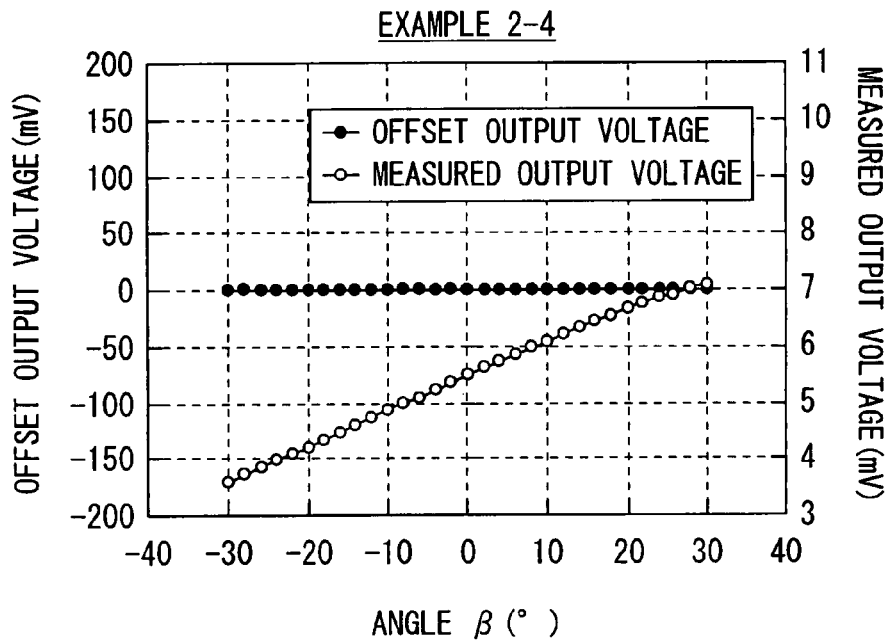
FIGS. 17A and 17B are characteristic diagrams showing the angle β dependence of offset output voltage and performance output voltage in Example 2-4 and Comparative Example 2-4.
Figure 17B:
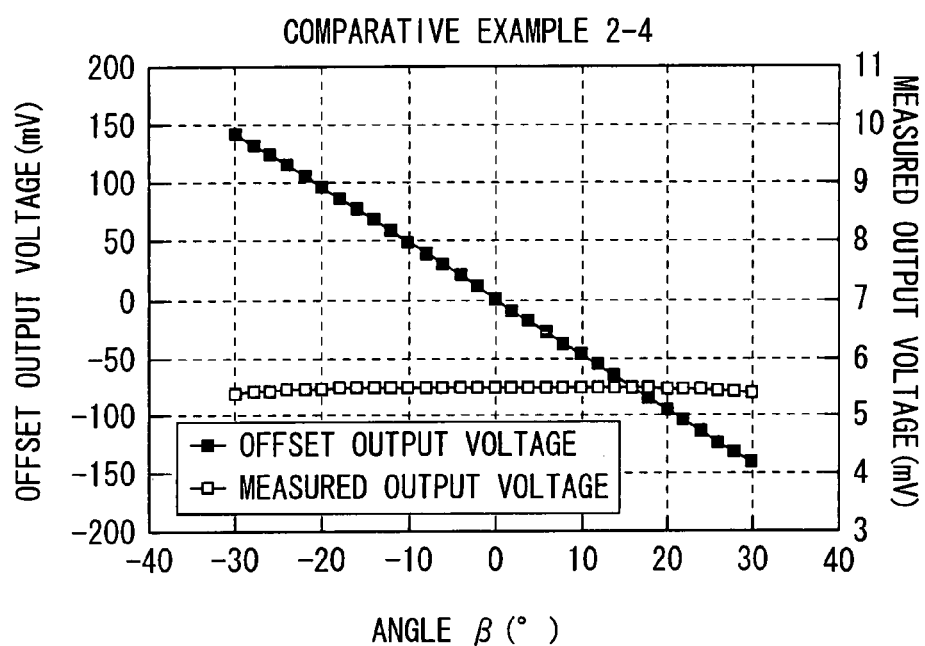

FIG. 14A shows the case where both of the exchange-coupling magnetic fields Hin1 and Hin2 are 4Oe (=(1/π)×10³ A/m), and both of the anisotropic magnetic fields Hk1 and Hk2 are 30Oe (=(7.5/π)×10³ A/m). FIG. 15A shows the case where both of the exchange-coupling magnetic fields Hin1 and Hin2 are 6Oe (=(1.5/π)×10³ A/m), and both of the anisotropic magnetic fields Hk1 and Hk2 are 30Oe (=(7.5/π)×10³ A/m). FIG. 16A shows the case where both of the exchange-coupling magnetic fields Hin1 and Hin2 are 8Oe (=(2/π)×10³ A/m), and both of the anisotropic magnetic fields Hk1 and Hk2 are 30Oe (=(7.5/π)×10³ A/m). FIG. 17A shows the case where both of the exchange-coupling magnetic fields Hin1 and Hin2 are 10Oe (=(2.5/π)×10³ A/m), and both of the anisotropic magnetic fields Hk1 and Hk2 are 30Oe (=(7.5/π)×10³ A/m). As Comparative Examples 2-1 to 2-4 corresponding to Examples 2-1 to 2-4, a magnetic sensor 2C shown in FIG. 19 was manufactured to conduct similar examinations. The results are shown in FIGS. 14B, 15B, 16B, and 17B.

As apparent from FIGS. 14A to 17B, it was confirmed that in Examples 2-1 to 2-4, the generation of the offset output voltage was sufficiently suppressed to permit high-precision measurement of the magnetic field Hm to be detected, as in Examples 1-1 to 1-4. Since Examples 2-1 to 2-4 had larger anisotropic magnetic fields Hk1 and Hk2 than Examples 1-1 to 1-4, the performance output voltages were somewhat lowered.

While the invention has been described in several preferred embodiments and examples, it will be understood that many changes and modifications may be made therein without limiting to the foregoing embodiments and the like. Although in the foregoing embodiment, the first and the second modules 10 and 20 are provided in different regions in the inplane direction of the integrated substrate 100, modification may be made as follows.

Figure 18:
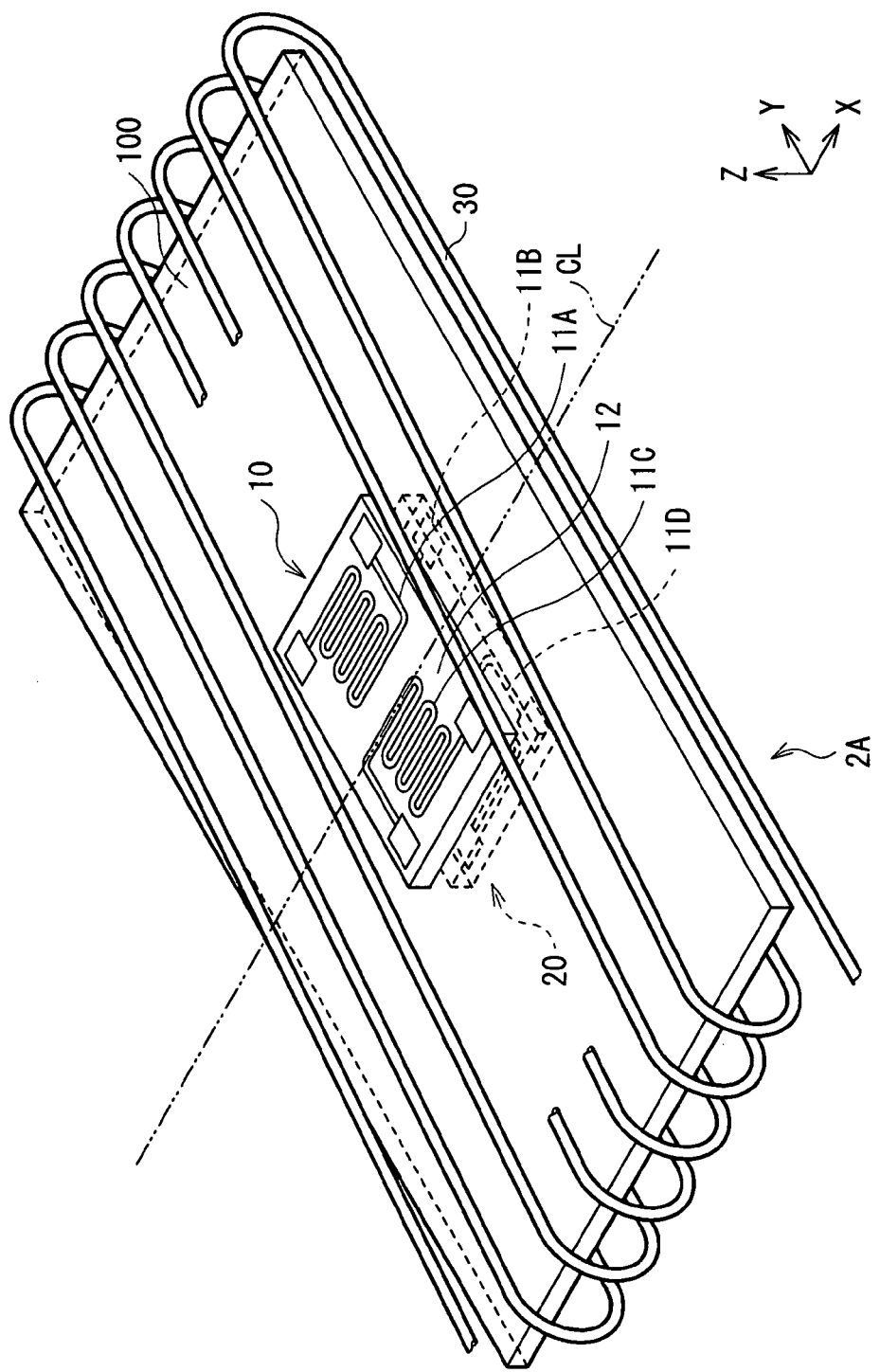
FIG. 18 is a perspective view showing the configuration of a magnetic sensor as a modification of the second preferred embodiment.
Figure 19:
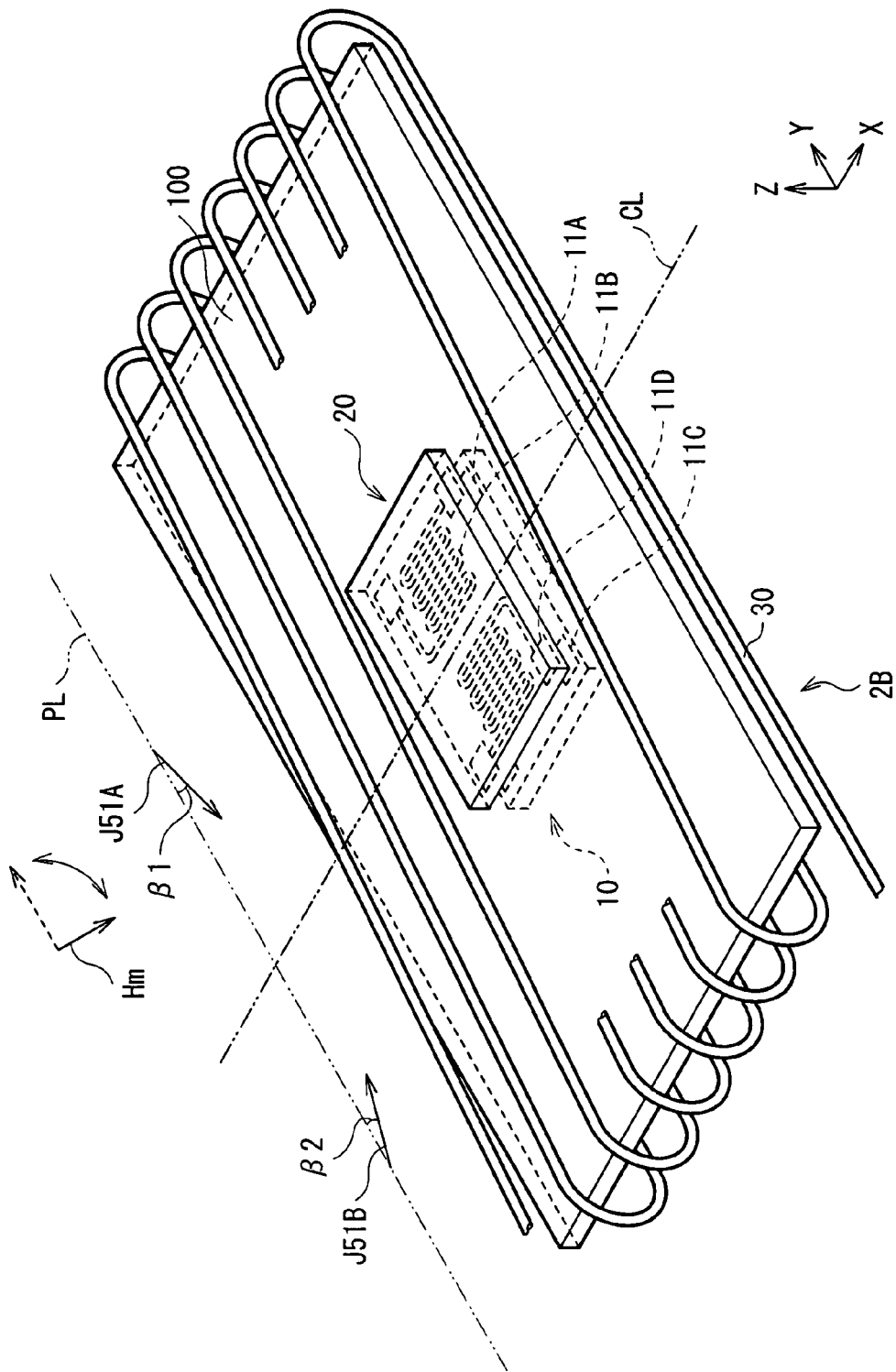
FIG. 19 is a perspective view showing the configuration of a magnetic sensor as other modification of the second preferred embodiment.
Figure 20:
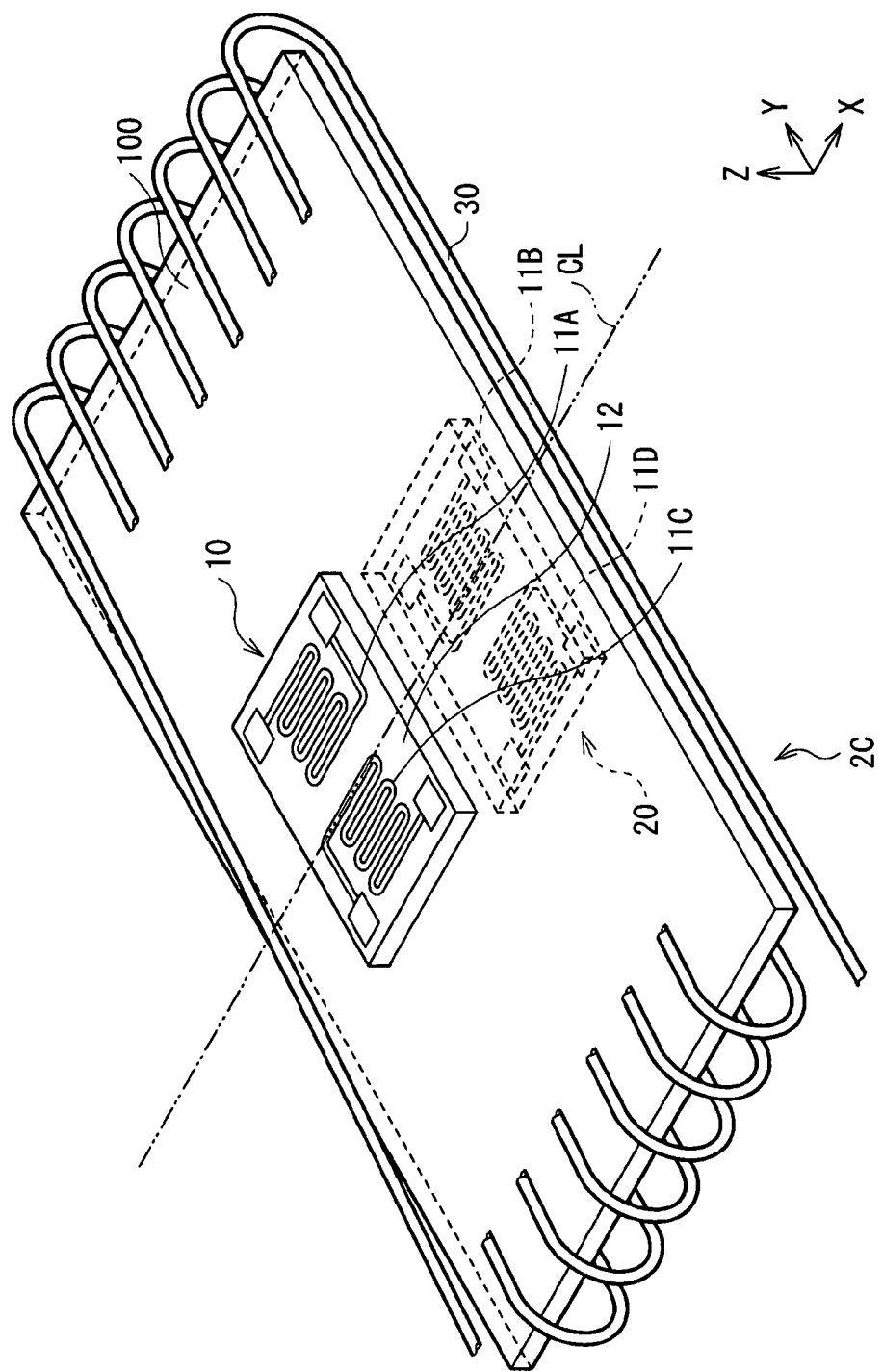
FIG. 20 is a perspective view showing the configuration of a magnetic sensor as other modification of the second preferred embodiment.

For example, like the magnetic sensor 2A shown in FIG. 18, the first and the second modules 10 and 20 may be positioned back to back in the corresponding regions in the inplane direction of the integrated substrate 100. Like the magnetic sensor 2B shown in FIG. 19, the first and the second modules 10 and 20 may be positioned face to face (namely the surface where the first MR element 11A is formed and the surface where the second MR element 11B may be opposed to each other). Like the magnetic sensor 2C shown in FIG. 20, the first and the second modules 10 and 20 may be arranged in different regions in the direction along the central axis CL. These cases are also included in the concept of the invention, provided that the magnetization direction and the magnetic field direction have the relationship as shown in FIGS. 8A and 8B, respectively. FIGS. 18 and 19 show the examples where the first and the second modules 10 and 20 are arranged so as to sandwich the integrated substrate 100 between the two. Alternatively, one to which the first and the second modules 10 and 20 are stuck back to back or stuck face to face may be arranged on one side of the integrated substrate 100. Even in the case of separately disposing the first and the second modules 10 and 20 in different regions in the inplane direction of the integrated substrate 100 (i.e. the cases in FIGS. 1, 7, and 20), the first and the second modules 10 and 20 may be provided on one side of the integrated substrate 100. In this case, either of the first module 10 or the second module 20 has to be turned over and arranged.

Figure 21A:
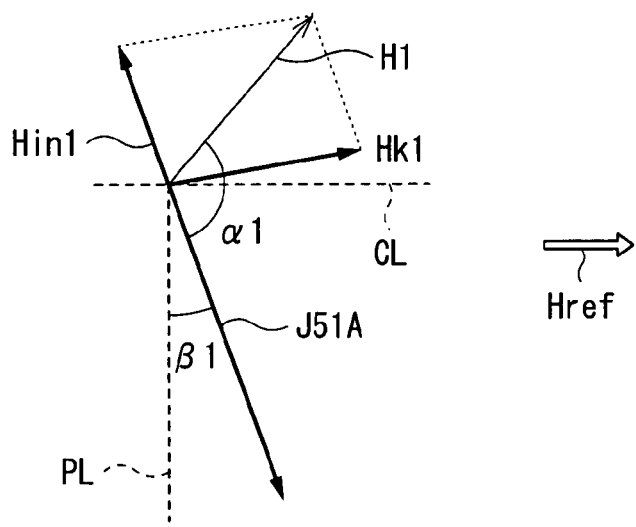
FIGS. 21A and 21B are explanatory drawings for explaining the relationship between the magnetization direction and the magnetic field direction in a key part of a magnetic sensor as a modification of the first preferred embodiment.
Figure 21B:
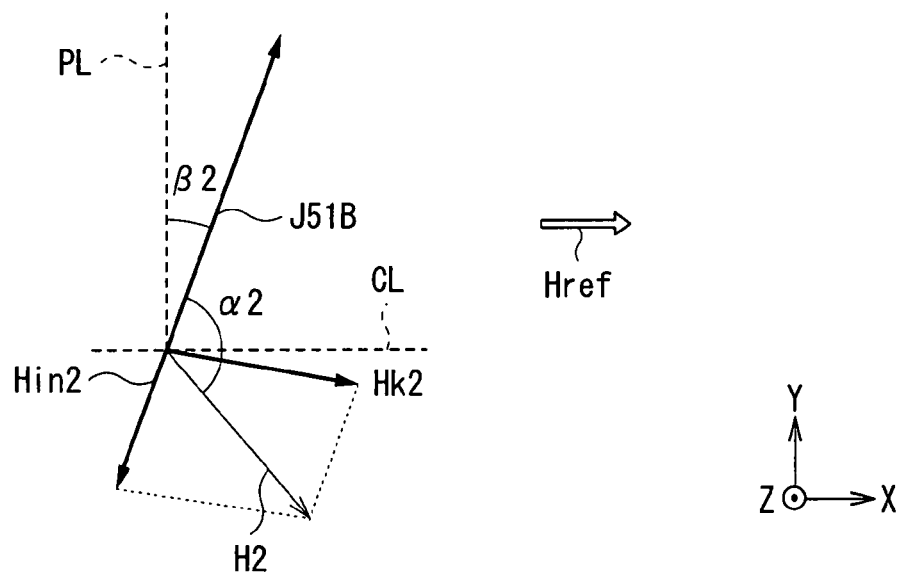

Although in the foregoing embodiment, the first to the fourth MR elements 11A to 11D are arranged to bring all of the directions of the anisotropic magnetic fields Hk1 to Hk4 into coincidence, the invention is not limited to this. For example, the anisotropic magnetic fields Hk1 and Hk2 may be deviated from the central axis CL, as shown in FIGS. 21A and 21B, respectively. It is however necessary that the direction of the anisotropic magnetic field Hk1 and the direction of the magnetization J51A have a rotationally symmetrical relationship with the direction of the anisotropic magnetic field Hk2 and the direction of the magnetization J51B, respectively, around the central axis CL. In this case, the initial condition can be obtained by applying the refresh magnetic field Href along the central axis CL, and the offset output voltage can be reduced to substantially zero. Here, the central axis CL is an axis parallel to the plane including all of the vectors of the anisotropic magnetic fields Hk1 and Hk2, the magnetizations J51A and J51B, and the exchange-coupling magnetic fields Hin1 and Hin2 (normally the stacked surfaces).

It should be understood by those skilled in the art that various modifications, combinations, sub-combinations and alterations may occur depending on design requirements and other factors insofar as they are within the scope of the appended claims or the equivalents thereof.

What is claimed is:

1. A magnetic sensor comprising first and second magnetoresistive elements each having a stacked structure, wherein
the stacked structure includes a pinned layer having a magnetization direction pinned in a certain direction, a nonmagnetic intermediate layer, and a free layer changing its magnetization direction depending on an external magnetic field and generating an anisotropic magnetic field in a direction different from the magnetization direction of the pinned layer, the pinned layer, the intermediate layer and the free layer in the first magneto-resistive element and the pinned layer, the intermediate layer and the free layer in the second magneto-resistive element come coincident with each other, respectively, when performing a rotational operation around a central axis of rotation parallel to stacked surfaces of the stacked structure or performing both of the rotational operation and a parallel shift operation, and a direction of the anisotropic magnetic field of the free layer in the first magneto-resistive element and a direction of the anisotropic magnetic field of the free layer in the second magneto-resistive element come coincident with each other when performing the rotational operation or both of the rotational operation and the parallel shift operation, the magnetic sensor further comprising:

a refresh magnetic field applying means for applying a refresh magnetic field having at least a magnitude of a magnetization saturation magnetic field of the free layer, to each of the first and the second magneto-resistive elements, along the central axis of rotation, and configured to apply the refresh magnetic field to each magneto-resistive element as needed, the refresh magnetic field applying means being switchable between an application state and a non-application state, wherein the rotational operation is a rotation of one magneto-resistive element substantially equal to 180° around the central axis of rotation, and before performing the rotational operation or both of the rotational operation and the parallel shift operation, a planar surface of the first magneto-resistive element does not overlap a planar surface of the second magneto-resistive element in a direction normal to the planar surface of the first magneto-resistive element.

2. The magnetic sensor according to claim 1, wherein a direction of the central axis of rotation coincides with the directions of the anisotropic magnetic fields in both of the first and the second magneto-resistive elements.

3. The magnetic sensor according to claim 1 wherein the refresh magnetic field applying means is formed of a coil.

4. The magnetic sensor according to claim 1, further comprising:

first and second constant current sources supplying constant currents of equivalent value to the first and the second magneto-resistive elements, respectively; and a differential detector for detecting a difference in voltage drops generated in the first and the second magneto-resistive elements by supplying the constant currents, respectively, the magnetic sensor detecting a magnetic field to be detected, based on the difference in the voltage drops.

5. The magnetic sensor according to claim 4 wherein, one end of the first magneto-resistive element and one end of the second magneto-resistive element are connected to each other at a first connecting point, one end of the first constant current source and one end of the second constant current source are connected to each other at a second connecting point, the other end of the first magneto-resistive element and the other end of the first constant current source are connected to each other at a third connecting point, and the other end of the second magneto-resistive element and the other end of the second constant current source are connected to each other at a fourth connecting point, wherein the magnetic field to be detected is detected based on a potential difference between the third connecting point and the fourth connecting point when a voltage is applied between the first connecting point and the second connecting point.

6. A magnetic sensor comprising first to fourth magneto-resistive elements each having a stacked structure, wherein the stacked structure includes a pinned layer having a magnetization direction pinned in a certain direction, a non-magnetic intermediate layer, and a free layer changing its magnetization direction depending on an external magnetic field and generating an anisotropic magnetic field in a direction different from the magnetization direction of the pinned layer, the pinned layer, the intermediate layer and the free layer in the first magneto-resistive element, and the pinned layer, the intermediate layer and the free layer in the third magneto-resistive element come coincident with each other, respectively, when performing a parallel shift operation, a direction of the anisotropic magnetic field of the free layer in the first magneto-resistive element and a direction of the anisotropic magnetic field of the free layer in the third magneto-resistive element come coincident with each other when performing the parallel shift operation, the pinned layer, the intermediate layer and the free layer in the second magneto-resistive element and the pinned layer, the intermediate layer and the free layer in the fourth magneto-resistive element come coincident with each other, respectively, when performing the parallel shift operation, a direction of the anisotropic magnetic field of the free layer in the second magneto-resistive element and a direction of the anisotropic magnetic field of the free layer in the fourth magneto-resistive element come coincident with each other when performing the parallel shift operation, the pinned layers, the intermediate layers and the free layers in the first magneto-resistive element and the third magneto-resistive element, and the pinned layers, the intermediate layers and the free layers in the second magneto-resistive element and the fourth magneto-resistive element come coincident with each other, respectively, when performing a rotational operation around a central axis of rotation parallel to stacked surfaces of the stacked structure or performing both of the rotational operation and the parallel shift operation, and the directions of the anisotropic magnetic field of the free layer in the first magneto-resistive element and the third magneto-resistive element, and the directions of the anisotropic magnetic field of the free layer in the second magneto-resistive element and the fourth magneto-resistive element come coincident with each other, respectively, when performing the rotational operation or both of the rotational operation and the parallel shift operation, the magnetic sensor further comprising:

a refresh magnetic field applying means for applying a refresh magnetic field having at least a magnitude of a magnetization saturation magnetic field of the free layer, to each of the first to the fourth magneto-resistive elements, along the central axis of rotation, and configured to apply the refresh magnetic field to each magneto-resistive element as needed, the refresh magnetic field applying means being switchable between an application state and a non-application state, wherein the rotational operation is a rotation of one magneto-resistive element substantially equal to 180° around the central axis of rotation, before performing the rotational operation or both of the rotational operation and the parallel shift operation, a planar surface of the first magneto-resistive element does not overlap a planar surface of the third magneto-resistive element in a direction normal to the planar surface of the first magneto-resistive element.

7. The magnetic sensor according to claim 6, wherein a direction of the central axis of rotation coincides with the directions of all of the anisotropic magnetic fields in the first to the fourth magneto-resistive elements.

8. The magnetic sensor according to claim 6, wherein the refresh magnetic field applying means is formed of a coil.

9. The magnetic sensor according to claim 6 wherein a bridge circuit is configured by following arrangement that:
one end of the first magneto-resistive element and one end of the second magneto-resistive element are connected to each other at a first connecting point,
one end of the third magneto-resistive element and one end of the fourth magneto-resistive element are connected to each other at a second connecting point,
the other end of the first magneto-resistive element and the other end of the third magneto-resistive element are connected to each other at a third connecting point, and
the other end of the second magneto-resistive element and the other end of the fourth magneto-resistive element are connected to each other at a fourth connecting point.

10. The magnetic sensor according to claim 1, wherein the magnetization direction of the pinned layer is orthogonal to that of a resultant magnetic field of an exchange-coupling magnetic field generated between the pinned layer and the free layer, and the anisotropic magnetic field of the free layer, for each magneto-resistive element.

11. The magnetic sensor according to claim 6, wherein the magnetization direction of the pinned layer is orthogonal to that of a resultant magnetic field of an exchange-coupling magnetic field generated between the pinned layer and the free layer, and the anisotropic magnetic field of the free layer, for each magneto-resistive element.

12. A method of manufacturing a magnetic sensor comprising steps of:
forming, in a batch, a plurality of magneto-resistive elements, each magneto-resistive element including a stacked structure including, in order on a substrate, a first ferromagnetic layer, a non-magnetic intermediate layer, and a second ferromagnetic layer having a magnetization direction pinned in a certain direction, the first ferromagnetic layer generating an anisotropic magnetic field in a direction different from the magnetization direction of the second ferromagnetic layer and changing its magnetization direction depending on an external magnetic field, and the second ferromagnetic layer having coercive force larger than that of the first ferromagnetic layer;
setting, in a batch, a magnetization direction of the second ferromagnetic layers in all of the plurality of magneto-resistive elements so as to be different from the direction of the anisotropic magnetic field;
cutting a first and second magneto-resistive elements out of the plurality of magneto-resistive elements formed on the substrate;
arranging the first ferromagnetic layer, the non-magnetic intermediate layer and the second ferromagnetic layer in the first magneto-resistive element and the first ferromagnetic layer, the non-magnetic intermediate layer and the second ferromagnetic layer in the second magneto-resistive element to come coincident with each other, respectively, when performing a rotational operation around a central axis of rotation parallel to stacked surfaces of the magneto-resistive elements or performing both of the rotational operation and a parallel shift operation;
providing a refresh magnetic field applying means for applying a refresh magnetic field having at least a magnitude of a magnetization saturation magnetic field of the first ferromagnetic layer, to each of the first and the second magneto-resistive elements, along the central axis of rotation, and applying the refresh magnetic field to each magneto-resistive element as needed, the applying being switchable between an application state and a non-application state,
wherein a direction of the anisotropic magnetic field of the first ferromagnetic layer in the first magneto-resistive element and a direction of the anisotropic magnetic field of the first ferromagnetic layer in the second magneto-resistive element come coincident with each other when performing the rotational operation or both of the rotational operation and the parallel shift operation, and
the rotational operation is a rotation of one magneto-resistive element substantially equal to 180° around the central axis of rotation, and before performing the rotational operation or both of the rotational operation and the parallel shift operation, a planar surface of the first magneto-resistive element does not overlap a planar surface of the second magneto-resistive element in a direction normal to the planar surface of the first magneto-resistive element.

13. The method of manufacturing a magnetic sensor according to claim 12, wherein a direction of the central axis of rotation coincides the directions of the anisotropic magnetic fields in both of the first and the second magneto-resistive elements.

14. The method of manufacturing a magnetic sensor according to claim 12, wherein
the direction of the anisotropic magnetic field is set by forming the first ferromagnetic layer while applying a magnetic filed in a certain direction,
the magnetization direction of the second ferromagnetic layers is set in a batch by performing annealing process while applying a magnetic field in a direction different from the directions of the anisotropic magnetic fields in both of the first and the second magneto-resistive elements.

15. A method of manufacturing a magnetic sensor comprising steps of:
forming, in a batch, a plurality of magneto-resistive elements, each magneto-resistive element including a stacked structure including, in order on a substrate, a first ferromagnetic layer, a non-magnetic intermediate layer, and a second ferromagnetic layer having a magnetization direction pinned in a certain direction, the first ferromagnetic layer generating an anisotropic magnetic field in a direction different from the magnetization direction of the second ferromagnetic layer and changing its magnetization direction depending on an external magnetic field, and the second ferromagnetic layer having coercive force larger than that of the first ferromagnetic layer;

setting, in a batch, a magnetization direction of the second ferromagnetic layers in all of the plurality of magneto-resistive elements so as to be different from the direction of the anisotropic magnetic field;

forming a pair of element modules each including a first and second magneto-resistive elements, by cutting the substrate with the plurality of magneto-resistive elements formed;

arranging the first ferromagnetic layer, the non-magnetic intermediate layer and the second ferromagnetic layer in the first magneto-resistive element and the first ferromagnetic layer, the non-magnetic intermediate layer and the second ferromagnetic layer in the second magneto-resistive element to come coincident with each other, respectively, when performing a rotational operation around a central axis of rotation parallel to stacked surfaces of the stacked structure or performing both of the rotational operation and a parallel shift operation;

providing a refresh magnetic field applying means for applying a refresh magnetic field having at least a magnitude of a magnetization saturation magnetic field of the first ferromagnetic layer, to each of the first and the second magneto-resistive elements, along the central axis of rotation, and applying the refresh magnetic field to each magneto-resistive element as needed, the applying being switchable between an application state and a non-application state, wherein a direction of the anisotropic magnetic field of the first ferromagnetic layer in the first magneto-resistive element and a direction of the anisotropic magnetic field of the first ferromagnetic layer in the second magneto-resistive element come coincident with each other when performing the rotational operation or both of the rotational operation and the parallel shift operation, and the rotational operation is a rotation of one magneto-resistive element substantially equal to 180° around the central axis of rotation, and before performing the rotational operation or both of the rotational operation and the parallel shift operation, a planar surface of the first magneto-resistive element does not overlap a planar surface of the second magneto-resistive element in a direction normal to the planar surface of the first magneto-resistive element.

16. The method of manufacturing a magnetic sensor according to claim 15, wherein a direction of the central axis of rotation coincides the directions of the anisotropic magnetic fields in both of the first and the second magneto-resistive elements.

17. The method of manufacturing a magnetic sensor according to claim 12, wherein magnetization directions of the second ferromagnetic layer are set in a batch so as to be orthogonal to that of resultant magnetic field of an exchange-coupling magnetic field generated between the first and the second ferromagnetic layers, and the anisotropic magnetic field of the first ferromagnetic layer.

18. The method of manufacturing a magnetic sensor according to claim 15, wherein magnetization directions of the second ferromagnetic layer are set in a batch so as to be orthogonal to that of resultant magnetic field of an exchange-coupling magnetic field generated between the first and the second ferromagnetic layers, and the anisotropic magnetic field of the first ferromagnetic layer.

\* \* \* \* \*